US010546772B2

(12) United States Patent
Chandhok et al.

(10) Patent No.: US 10,546,772 B2
(45) Date of Patent: Jan. 28, 2020

(54) SELF-ALIGNED VIA BELOW SUBTRACTIVELY PATTERNED INTERCONNECT

(71) Applicant: Intel Corporation, Santa Clara, CA (US)

(72) Inventors: Manish Chandhok, Beaverton, OR (US); Richard E. Schenker, Portland, OR (US); Hui Jae Yoo, Hillsboro, OR (US); Kevin L. Lin, Beaverton, OR (US); Jasmeet S. Chawla, Hillsboro, OR (US); Stephanie A. Bojarski, Beaverton, OR (US); Satyarth Suri, Portland, OR (US); Colin T. Carver, Portland, OR (US); Sudipto Naskar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/070,172

(22) PCT Filed: Mar. 30, 2016

(86) PCT No.: PCT/US2016/025074
§ 371 (c)(1),
(2) Date: Jul. 13, 2018

(87) PCT Pub. No.: WO2017/171760
PCT Pub. Date: Oct. 5, 2017

(65) Prior Publication Data
US 2019/0035677 A1    Jan. 31, 2019

(51) Int. Cl.
*H01L 23/52*    (2006.01)
*H01L 21/768*   (2006.01)
*H01L 21/311*   (2006.01)
*H01L 23/522*   (2006.01)

(52) U.S. Cl.
CPC .. *H01L 21/76802* (2013.01); *H01L 21/31144* (2013.01); *H01L 21/76847* (2013.01); *H01L 21/76883* (2013.01); *H01L 23/5226* (2013.01)

(58) Field of Classification Search
CPC ......... H01L 21/76847; H01L 21/76802; H01L 21/31144; H01L 23/5226
USPC ........................................................ 257/751
See application file for complete search history.

(56) References Cited

U.S. PATENT DOCUMENTS

| 6,911,397 | B2* | 6/2005 | Jun | ................... | H01L 21/76807 |
|---|---|---|---|---|---|
| | | | | | 438/700 |
| 8,987,862 | B2* | 3/2015 | Kastenmeier | ..... | H01L 21/76802 |
| | | | | | 257/532 |
| 9,041,217 | B1* | 5/2015 | Bristol | ................. | H01L 23/528 |
| | | | | | 257/774 |

(Continued)

OTHER PUBLICATIONS

International Search Report and Written Opinion for International Patent Application No. PCT/US2016/025074 dated Dec. 20, 2016, 9 pgs.

*Primary Examiner* — Luan C Thai
(74) *Attorney, Agent, or Firm* — Schwabe, Williamson & Wyatt, P.C.

(57) ABSTRACT

A plurality of interconnect features are formed in an interconnect layer on a first insulating layer on a substrate. An opening in the first insulating layer is formed through at least one of the interconnect features. A gap fill layer is deposited in the opening.

20 Claims, 16 Drawing Sheets

(56) References Cited

U.S. PATENT DOCUMENTS

| | | |
|---|---|---|
| 9,362,371 B2* | 6/2016 | Meiser .............. H01L 21/76877 |
| 9,431,297 B2* | 8/2016 | Wu ................... H01L 21/76808 |
| 2006/0148251 A1 | 7/2006 | Broekaart et al. |
| 2009/0142921 A1 | 6/2009 | Petti |
| 2010/0155959 A1 | 6/2010 | Park et al. |
| 2015/0171009 A1 | 6/2015 | Bristol et al. |
| 2015/0179513 A1 | 6/2015 | Myers et al. |

* cited by examiner

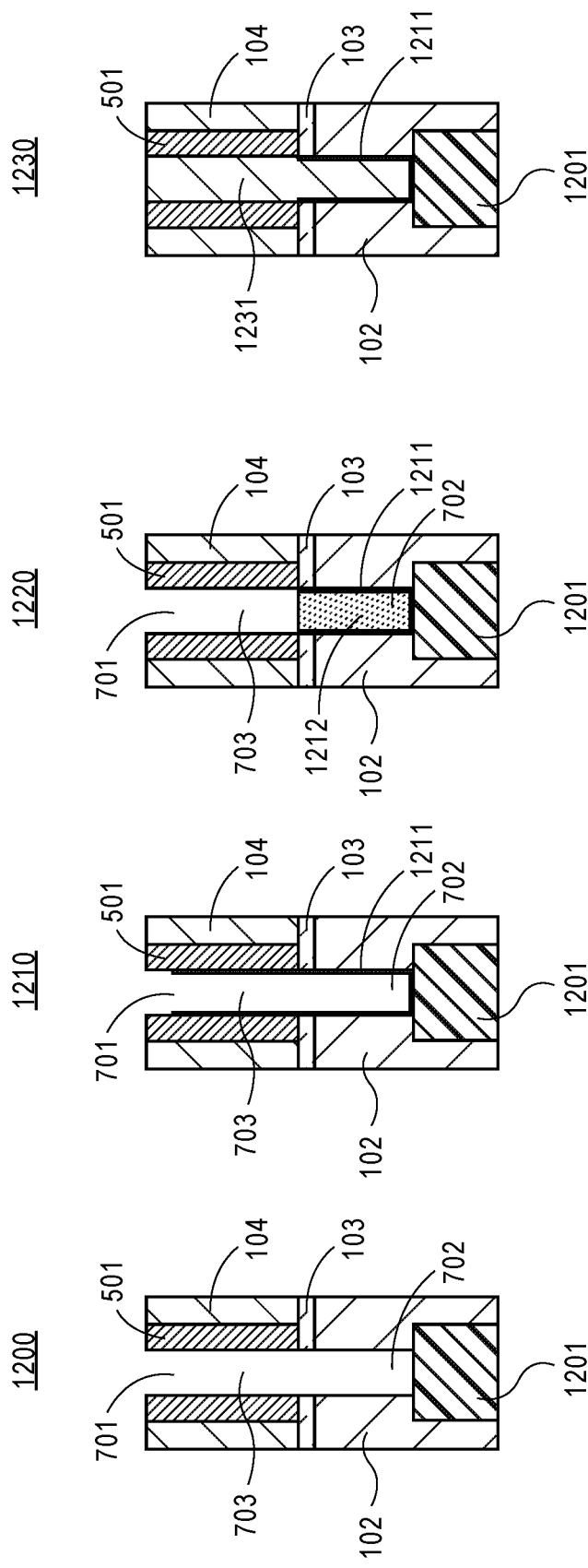

SELF-ALIGNED VIA BELOW SUBTRACTIVELY PATTERNED INTERCONNECT

CROSS-REFERENCE TO RELATED APPLICATION

This patent application is a U.S. National Phase Application under 35 U.S.C. § 371 of International Application No. PCT/US2016/025074, filed Mar. 30, 2016, entitled "SELF-ALIGNED VIA BELOW SUBTRACTIVELY PATTERNED INTERCONNECT," which designates the United States of America, the entire disclosure of which is hereby incorporated by reference in its entirety and for all purposes.

FIELD

Embodiments as described herein relate to a field of electronic device manufacturing, and in particular, to an integrated circuit (IC) manufacturing.

BACKGROUND

Generally, an interconnect structure incorporated into the IC includes one or more levels of metal lines to connect the electronic devices of the IC to one another and to external connections. An interlayer dielectric is placed between the metal levels of the IC for insulation.

Typically, an additive patterning technique, known as a Damascene process, is used to fabricate a copper interconnect. In this process, the underlying silicon oxide insulating layer is patterned to form trenches. The trenches in the insulating layer are filled with a thick layer of copper, and chemical-mechanical polishing (CMP) is used to remove the copper that extends above the top of the insulating layer. Copper within the trenches of the insulating layer is not removed and becomes the patterned conductor.

Typically, in a Dual Damascene (DD) process, two features of copper interconnect are formed at once, e.g., a trench overlying a via, may both be filled with a single copper deposition. Typically, the DD interconnects need a liner for adhesion and a hermetic barrier to protect the metal. The liner in the DD interconnects is typically non-conducting and adds to the line resistance.

As the size of the IC decreases, the spacing between the metal lines decreases. This leads to increase in the coupling capacitance between the metal lines. Increase in the coupling capacitance between the metal lines has a negative impact on signal transmission along metal lines. Furthermore, increase in the coupling capacitance increases energy consumption of the integrated circuit.

Another patterning technique to form an interconnect is a subtractive patterning technique. However, subtractive interconnects are not self-aligned to the via below. Generally, subtractive patterning of the metal lines is done independently of the vias below, so that location of the via below the metal layer cannot be accurately determined. In conventional subtractive patterning techniques, the vias below are mis-aligned to the lines above that increases via resistance and leads to potential shorting to the wrong metal line. The via-line misalignment causes device failures, decreases yield and increases manufacturing cost.

BRIEF DESCRIPTION OF THE DRAWINGS

Embodiments of the invention may be best understood by referring to the following description and accompanying drawings that are used to illustrate embodiments of the invention. In the drawings:

FIG. 12A is a view showing a portion of the electronic device structure similar to a portion shown in FIG. 7A.

FIG. 12B is a view similar to FIG. 12A after a liner layer is deposited into the opening according to one embodiment.

FIG. 12C is a view similar to FIG. 2B after a hard mask layer is deposited on a portion of the liner in the via portion of the opening and the liner layer is recessed according to one embodiment.

FIG. 12D is a view similar to FIG. 2C after removing the hard mask layer and depositing a gap fill layer in the opening according to one embodiment.

DETAILED DESCRIPTION

Figure 1A:
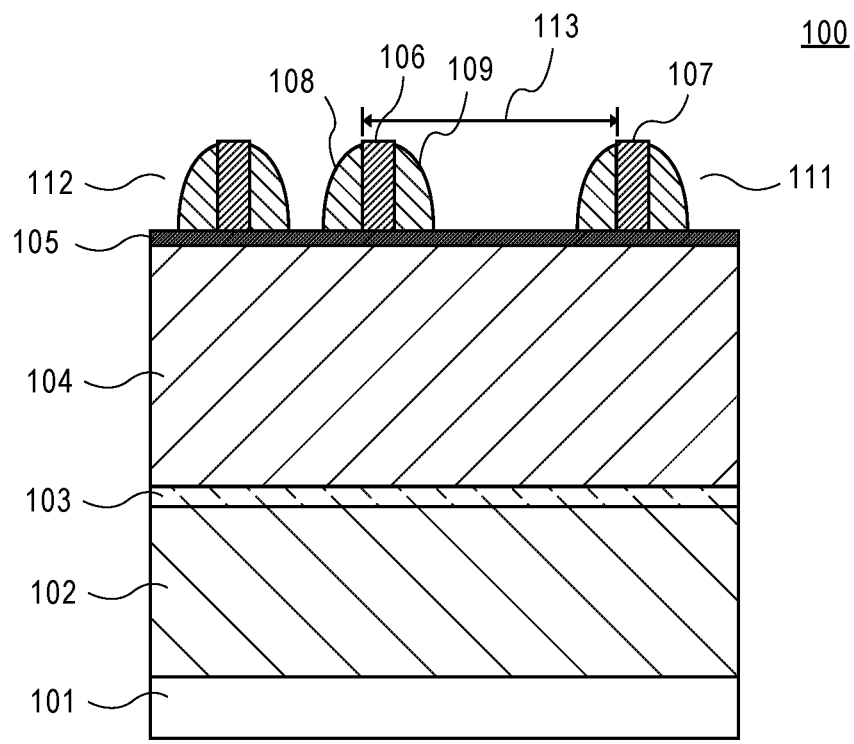
FIG. 1A shows a cross-sectional view of a portion of an electronic device structure according to one embodiment.

Methods and apparatuses to provide a self-aligned via below a subtractively patterned interconnect are described. Generally, for a subtractive patterning technique, fabrication of an integrated circuit involves etching an interconnect layer (e.g., a metal, or other interconnect layer) using a mask. The subtractively patterned interconnects provide lower line resistance and capacitance benefits over conventional dual damascene interconnects. Subtractive interconnects can also have patterned mono-lithic vias self-aligned to the metal above to enable maskless airgaps to reduce capacitance.

In one embodiment, processes to create self-aligned vias below a subtractively patterned interconnect are described. In one embodiment, an interconnect structure includes a via that is self-aligned to a conductive line that is above the via.

In one embodiment, the same metal is used for the conductive line and the self-aligned via below that conductive line to reduce the via resistance.

In one embodiment, the interconnect lines are subtractively patterned. A cut pattern for the line ends is used to create a template for the via below. The via hole below is then etched into the via ILD. The via ILD hole and the line end cut are filled with the subtractive metal, thus creating a via self-aligned to the subtractive interconnect lines above, so that the alignment between the interconnect lines and the underlying vias is substantially error free.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Figure 1B:
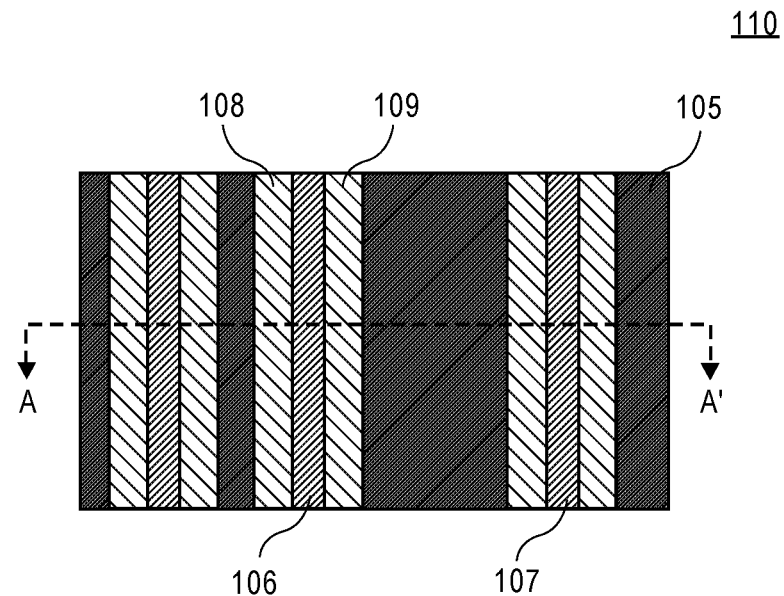
FIG. 1B shows a top view of the portion of the electronic device structure shown in FIG. 1A.

FIG. 1A shows a cross-sectional view 100 of a portion of an electronic device structure according to one embodiment. FIG. 1B shows a top view 110 of the portion of the electronic device structure shown in FIG. 1A. The cross-sectional view 100 depicted in FIG. 1A is along an A-A' axis. As shown in FIG. 1A, a patterned hard mask layer 111 is deposited on a hard mask layer 105 on an interconnect layer 104 on an etch stop layer 103 on an insulating layer 102 on a substrate 101.

As shown in FIGS. 1A and 1B, patterned hard mask layer 111 comprises a plurality hard mask features, such as a hard mask feature 106 and a hard mask feature 107. In one embodiment, a distance 113 between the hard mask features (pitch) is greater than about 80 nanometers (nm). In one embodiment, a distance 113 between the hard mask features (pitch) is less than about 80 nm. In one embodiment, the pitch is from about 10 nm to about 80 nm.

A spacer layer 112 comprising spacers, such as a spacer 108 and a spacer 109 is formed on the hard mask layer 105. Each of the hard mask features comprises a top portion and opposing sidewalls. The spacers are deposited on the opposing sidewalls of each of the hard mask features. For example, spacers 108 and 109 are deposited along the opposing sidewalls of the hard mask feature 106.

In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In another embodiment, substrate 101 represents a previous interconnect layer. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, insulating layer 102 is an interlayer dielectric (ILD) layer. In one embodiment, ILD 102 is a via ILD that is etch selective to a fillable trench ILD deposited later on in a process. In alternative embodiments, materials for the via ILD can be for example, silicon nitride, silicon oxide nitride (SiON), silicon oxide carbide nitride (SiOCN), silicon oxide carbide (SiOC), silicon carbide (SiC), variants of silicon dioxide (e.g., carbon doped silicon oxide) that are etch selective to the trench ILD. In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 102 includes a dielectric material having k-value less than 5. In one embodiment, insulating layer 102 includes a dielectric material having k-value less than 2. In alternative embodiments, insulating layer 102 includes a nitride, oxide, a polymer, phosphosilicate glass, fluorosilicate (SiOF) glass, organosilicate glass (SiOCH), other electrically insulating layer determined by an electronic device design, or any combination thereof.

In one embodiment, the thickness of the insulating layer 102 is determined by design. In one embodiment, the insulating layer 102 is deposited to the thickness from about 10 nanometers (nm) to about 2 microns (μm). In one embodiment, ILD 102 is less than 100 nm thick. According to other embodiments, the ILD 103 may be less than 40 nm thick. An additional embodiment may further include an ILD 103 having a thickness in an approximate range from about 3 nm to about 10 nm.

In an embodiment, insulating layer 102 is deposited on substrate 101 using one of deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In an embodiment, an etch stop layer 103 is formed on the ILD 102. In one embodiment, the etch stop layer 103 is used to provide a barrier to a trench etched in the interconnect layer 104. In one embodiment, the material of the etch stop layer 102 is etch selective to the material of the interconnect layer that is being etched.

In one embodiment, the etch stop layer 103 is a dielectric material, e.g., a nitride or an oxide. In one embodiment, the etch stop layer 103 is a silicon dioxide, silicon nitride, silicon carbide, or any combination thereof. In one embodiment, etch stop layer 103 acts as an adhesion layer to provide adhesion to interconnect layer 104 of a metal. In one embodiment, etch stop layer 103 is a metallic layer, e.g., as TiN, Ta, TaN. In one embodiment an adhesion layer (not shown) is deposited on the etch stop layer 103 to provide adhesion to the metal interconnect layer deposited thereon. In one embodiment, the thickness of the etch stop layer 103 is from about 3 nm to about 10 nm.

In one embodiment, the interconnect layer 104 is a layer of the material that can be subtractively patterned. Generally, for a subtractive patterning technique, a mask is used to perform a subtractive etch of the underlying material. In one embodiment, interconnect layer 104 is a subtractive metal layer, e.g., Cu, W, Ru, Co, Al, Ag, or other metal layer that can be subtractively patterned. In another embodiment, interconnect layer 104 is a semiconductor layer, e.g., a silicon layer (polysilicon, amorphous silicon (aSi), a germanium layer (polygermanium, amorphous germanium (aGe), silicon germanium alloys of various Si:Ge ratios, other semiconductor layer, or any combination thereof.

In one embodiment, the interconnect layer is e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the interconnect layer are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In one embodiment, the thickness of the interconnect layer 104 is from about 20 nm to about 200 nm.

In an embodiment, the interconnect layer 104 is deposited using one of deposition techniques, such as but not limited to a CVD, PVD, MBE, MOCVD, ALD, spin-on, electroless, electro-plating, or other deposition techniques known to one of ordinary skill in the art of microelectronic device manufacturing.

In one embodiment, hard mask layer 105 is a nitride layer, e.g., a silicon nitride, a silicon oxide nitride, silicon oxide, amorphous silicon, polysilicon, a carbon layer, e.g., amorphous carbon, silicon carbide, germanium, other hard mask layer, or any combination thereof. The hard mask layer 105 can be deposited using one of the hard mask layer deposition techniques known to one of ordinary skill in the art of electronic device manufacturing.

In one embodiment, hard mask layer 111 a nitride layer, e.g., a silicon nitride, a silicon oxide nitride, silicon oxide, amorphous silicon, polysilicon, a carbon layer, e.g., amorphous carbon, silicon carbide, germanium, other hard mask layer, or any combination thereof. The hard mask layer 111 can be deposited using one of the hard mask layer deposition techniques known to one of ordinary skill in the art of electronic device manufacturing. In one embodiment, a material of hard mask layer 111 is different from the material of hard mask layer 105. In one embodiment, hard mask layer 111 is patterned and etched to form features 107 and 106 using one of the hard mask patterning and etching techniques known to one of ordinary skill in the art of electronic device manufacturing.

In one embodiment, spacers 108 and 109 are deposited using one of spacer deposition techniques known to one of ordinary skill in the art of electronic device manufacturing. For example, a conformal layer of spacer material may be conformally deposited over the surfaces of the hard mask features, such as features 106 and 107. After the conformal deposition, a spacer forming etch may be implemented. Embodiments include an anisotropic dry etching process that selectively removes the portions of the deposited layer that are formed on horizontal surfaces of the hard mask feature leaving the spacers along the sidewalls of the hard mask features. In an embodiment, the spacers may be a conformal material, such as, but not limited to $SiO_2$, SiN, $HfO_2$, TiO, ZrO, AlN, AlO, TiN, aSi, SiC and any combinations thereof. In at least some embodiments, the material of the spacers has a substantially high etch selectivity over the material used to form the hard mask features for a given etching process. According to such embodiments, the hard mask features are resistant to an etching process that etches away the spacers 108 and 109. In one embodiment, the etching rate of the spacer layer is substantially greater than the etching rate of the hard mask layer 111 for a given etching process.

Figure 2A:
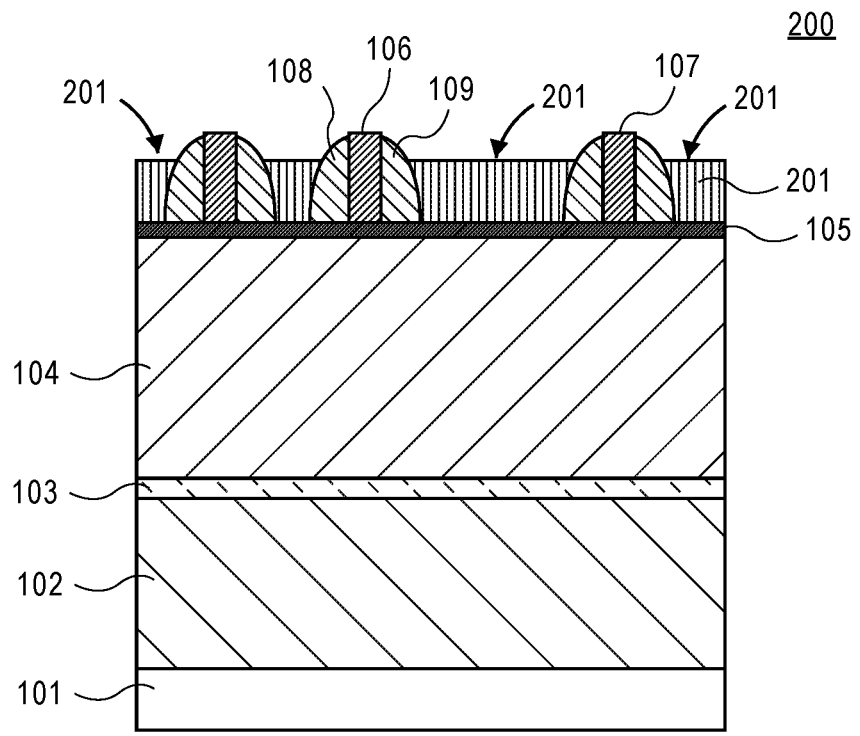
FIG. 2A is a view similar to FIG. 1A after a second hard mask layer is deposited on a first hard mask layer according to one embodiment.
Figure 2B:
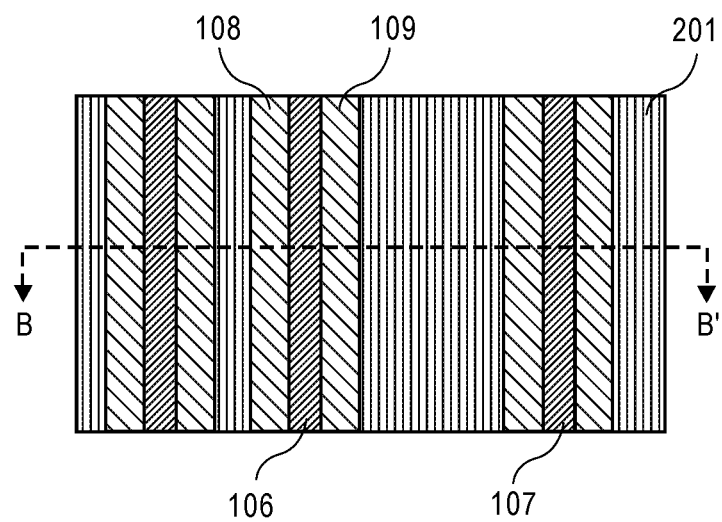
FIG. 2B is a top view of the portion of electronic device structure shown in FIG. 2A.

FIG. 2A is a view 200 similar to FIG. 1A after a hard mask layer 201 is deposited on hard mask layer 105 according to one embodiment. FIG. 2B is a top view 210 of the portion of electronic device structure shown in FIG. 2A. View 200 is a cross-sectional view along an axis B-B'. Hard mask layer 201 is deposited on portions of the hard mask layer 105 exposed by the hard mask features and spacers, as shown in FIGS. 2A and 2B. In one embodiment, hard mask layer 201 is a fillable hard mask layer. In an embodiment, hard mask layer 201 is a spin-on based material, or a flowable material e.g., an oxide layer, e.g., silicon oxide (e.g., $SiO_2$), aluminum oxide ("$Al_2O_3$"), or other oxide layer, a nitride layer, e.g., silicon nitride (e.g., $Si_3N_4$), or other nitride layer, a carbide layer (e.g., carbon, SiOC), or other carbide layer, an oxynitride layer, (e.g., SiON), or any combination thereof.

Generally, the material choices for the hard masks (e.g., hard mask layers 111 and 201) are such that the hard masks do not etch away during the trench etch in the underlying one or more layers (e.g., interconnect layer 104, etch stop layer 103, insulating layer 102) later in a process. In one embodiment, each of the hard mask layers 111 and 201 is one or more of oxides, nitrides, oxynitrides, metallic oxides, carbides, oxycarbides, metallic nitrides, metallic carbides, or any combination thereof.

In an embodiment, hard mask layer 201 is deposited using one of deposition techniques, such as but not limited to a CVD, PVD, MBE, MOCVD, ALD, spin-on, or other deposition techniques known to one of ordinary skill in the art of microelectronic device manufacturing.

In an embodiment, the thickness of the hard mask layer 201 is substantially similar to the height of the hard mask features 106 and 107. In one embodiment, the thickness of the hard mask layer 201 is from about 10 nm to about 200 nm. In more specific embodiment, the thickness of the hard mask layer 201 is from about 20 nm to about 500 nm.

In one embodiment, a material of hard mask layer 201 is different from the material of hard mask layer 111. In at least some embodiments, the material of the features of hard mask layer 111 has a high etch selectivity over the material of the hard mask layer 201 for a given etching process. In at least some embodiments, the hard mask layer 201 is resistant to an etching process that etches away the features of the hard mask layer 111.

Figure 3A:
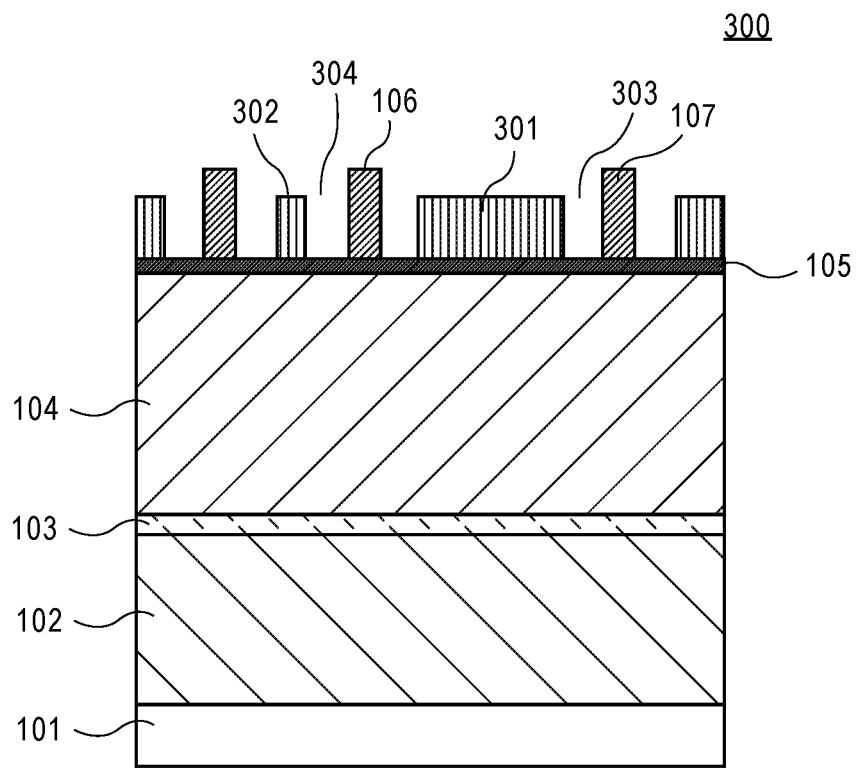
FIG. 3A is a view similar to FIG. 2A after the spacers are removed according to one embodiment.
Figure 3B:
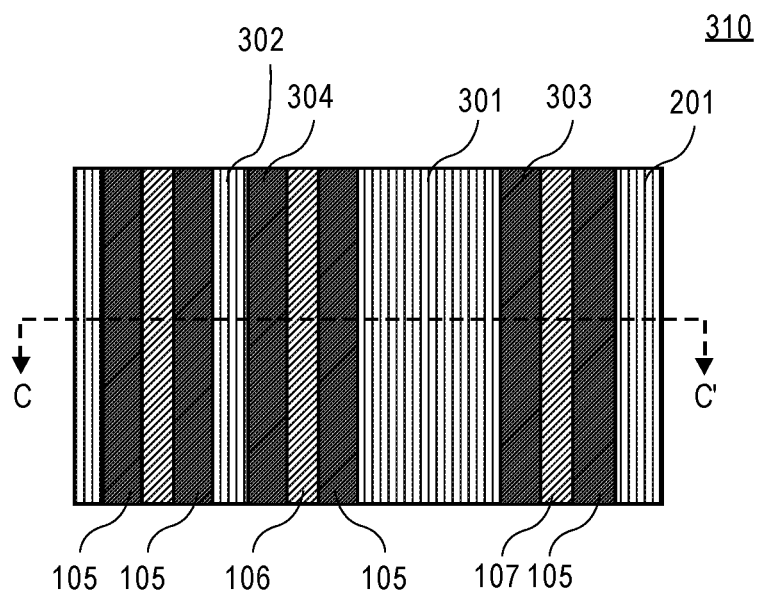
FIG. 3B is a top view of the portion of electronic device structure shown in FIG. 3A.

FIG. 3A is a view 300 similar to FIG. 2A after the spacers are removed according to one embodiment. FIG. 3B is a top view 310 of the portion of electronic device structure shown in FIG. 3A. View 300 is a cross-sectional view along an axis C-C'. As shown in FIGS. 3A and 3B, the spacers, such as spacers 108 and 109 are selectively removed to expose portions of the hard mask layer 105, such as portions 303 and 304, so that a plurality of hard mask features, such as hard mask features 106 and 107 and hard mask features 301 and 302 are formed. In one embodiment, the hard mask features define a pattern to form trenches in interconnect layer 104, as described in further detail below. As shown in FIGS. 3A and 3B, a distance (pitch) 305 between the hard mask features 301 and 107 is smaller than initial distance 113 between the hard mask features 106 and 107 depicted in FIGS. 1A and 1B. In one embodiment, initial pitch (e.g., distance 113) as defined by a photoresist that is printed by e.g., a 193 nm lithography (~80 nm and above) is halved by the spacers of the spacer layer 112 and then halved by the spacers 108, 109, so that pitch 305 is about one quarter of the pitch 113. In one embodiment, the spacers are selectively removed using one or more of wet etching, dry etching, or a combination thereof techniques known to one of ordinary skill in the art of electronic device manufacturing.

Figure 4A:
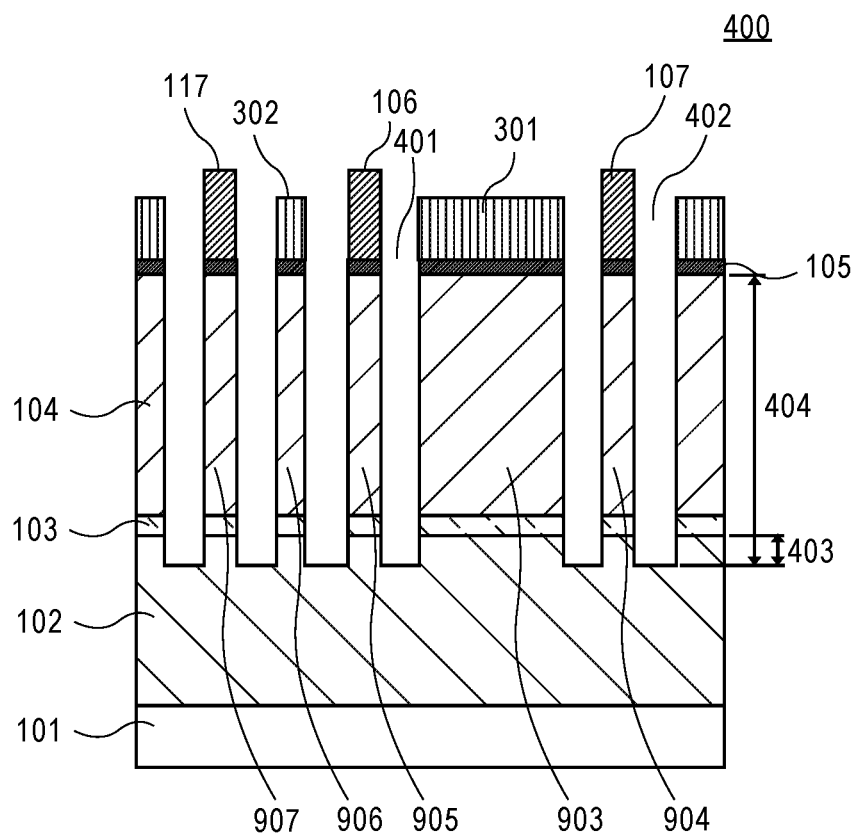
FIG. 4A is a view similar to FIG. 3A after trenches are formed in the interconnect layer according to one embodiment.
Figure 4B:
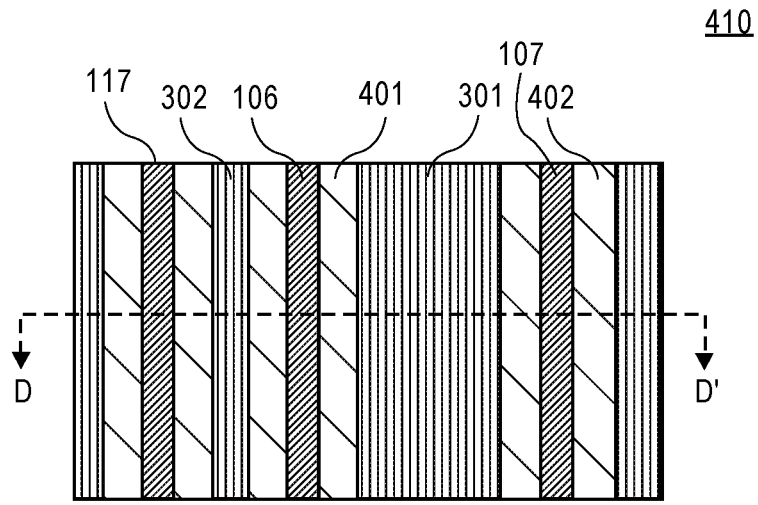
FIG. 4B is a top view of the portion of electronic device structure shown in FIG. 4A.

FIG. 4A is a view 400 similar to FIG. 3A after trenches, such as trenches 401 and 402 are formed in the interconnect layer 104 using the features of the hard mask layer 111 and the features of the hard mask layer 201 as a mask according to one embodiment. FIG. 4B is a top view 410 of the portion of electronic device structure shown in FIG. 4A. View 400 is a cross-sectional view along an axis D-D'. As shown in FIG. 4A, the trenches in the interconnect layer are formed between interconnect features, such as interconnect features 903, 904, 905, 906 and 907 that are underneath the corresponding hard mask features 301, 107, 106, 302 and 117.

In one embodiment, the interconnect features 903, 904, 905, 906 and 907 are conductive features. In one embodiment, the interconnect features 903, 904, 905, 906 and 907 are conductive lines. In alternative embodiments, the interconnect features 903, 904, 905, 906 and 907 are conductive lines, conductive vias, trenches, or any combination thereof. In one embodiment, the distance between the interconnect features (pitch) is less than about 80 nm. In one embodiment, the pitch is from about 10 nanometers (nm) to about 80 nm.

In one embodiment, the width of the interconnect feature is in an approximate range from about 5 nm to about 40 nm. In one embodiment, the height of the interconnect feature is determined by the thickness of the interconnect layer 104. In one embodiment, the height of the interconnect feature is in the approximate range from about 5 nm to about 200 nm.

The trenches 401 and 402 extend through etch stop layer 103 down to a portion of insulating layer 102 that is at a depth 403 from etch stop layer 103 to prevent shortage between the interconnect features of the interconnect layer 104. In one embodiment, the interconnect layer 104 is over etched into insulating layer 102 to depth 403 that is from about 5 nm to about 10 nm. In one embodiment, the depth 404 to width aspect ratio of the trench 402 is approximately 1:1 or greater.

In one embodiment, the trenches in the interconnect layer that extend into a portion of the insulating layer are formed using a dry etching technique (e.g., a plasma etch, or other dry etching technique known to one of ordinary skill in the art of electronic device manufacturing). In more specific embodiment, the trenches in the interconnect layer that extend into a portion of the insulating layer are formed using one or more non-selective plasma etching techniques, e.g., using a physical ion bombardment so that the portions of the interconnect layer and the insulating layer are etched in one directional plasma etching process. In alternative embodiments, the trenches in the interconnect layer that extend into a portion of the insulating layer are formed using one or more of the wet etching, dry etching, or a combination thereof techniques known to one of ordinary skill in the art of microelectronic device manufacturing.

Figure 5A:
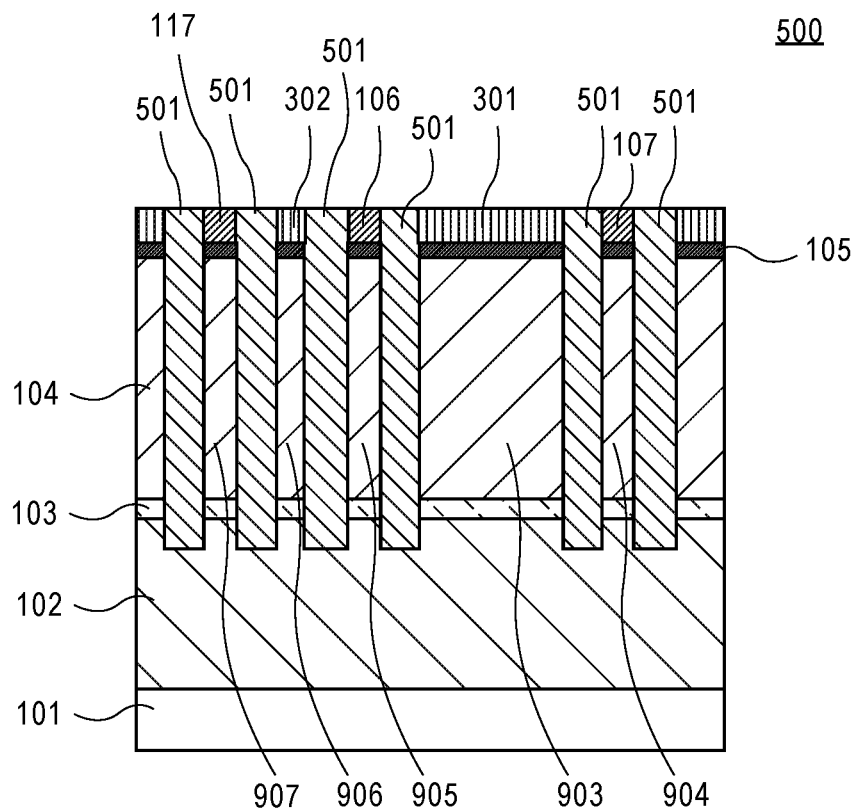
FIG. 5A is a view similar to FIG. 4A after an insulating layer is deposited into the trenches according to one embodiment.
Figure 5B:
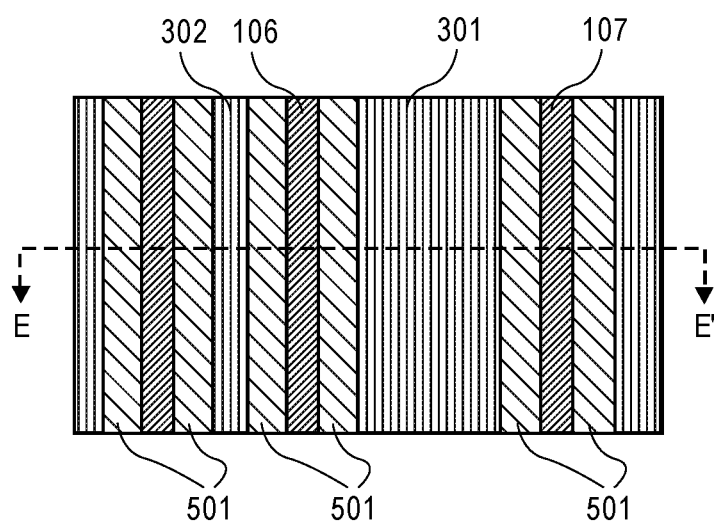
FIG. 5B is a top view of the portion of electronic device structure shown in FIG. 5A.

FIG. 5A is a view 500 similar to FIG. 4A after an insulating layer 501 is deposited into the trenches according to one embodiment. FIG. 5B is a top view 510 of the portion of electronic device structure shown in FIG. 5A. View 500 is a cross-sectional view along an axis E-E'.

As shown in FIGS. 5A and 5B, insulating layer 501 fills the trenches, such as trenches 401 and 402. In one embodiment, insulating layer 501 is a fillable dielectric layer. In more specific embodiment, insulating layer 501 is a low k dielectric layer to reduce capacitance between the interconnect features of the interconnect layer 104. In one embodiment, insulating layer 501 is etch selective to the insulating layer 102. In one embodiment, the etching rate of the trench insulating layer 501 is substantially greater than the etching rate of the via insulating layer 102 for a given etching process. In one embodiment, insulating layer 501 is etched isotropically to form an air gap later in a process, as described below. In one embodiment, the material of the insulating layer 501 is one or more of silicon dioxide SiO2 and variants thereof, e.g., a carbon doped silicon oxide, a silicon, germanium, or a metallic oxide that is etch selective to the insulating layer 102. In one embodiment, interconnect layer 104 is a metallic layer, and insulating layer 501 is silicon, germanium, or any combination thereof.

In alternative embodiments, materials for the insulating layer 501 can be for example, carbon doped silicon nitride, silicon nitride, silicon oxide nitride (SiON), silicon oxide carbide nitride (SiOCN), silicon oxide carbide (SiOC), silicon carbide (SiC), variants of silicon dioxide (e.g., carbon doped silicon oxide) that are etch selective to the via ILD. In one embodiment, insulating layer 501 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 501 includes a dielectric material having k-value less than 5. In one embodiment, insulating layer 501 includes a dielectric material having k-value less than 2. In alternative embodiments, insulating layer 501 includes a nitride, oxide, a polymer, phosphosilicate glass, fluorosilicate (SiOF) glass, organosilicate glass (SiOCH), other electrically insulating layer determined by an electronic device design, or any combination thereof.

In one embodiment, insulating layer 501 is deposited into the trenches and onto the features of the hard mask layers 111 and 201. In one embodiment, the portions of the insulating layer 501 that extend above the top of the features of the hard mask layers 111 and 201 are removed using one of the chemical-mechanical polishing (CMP) techniques known to one of ordinary skill in the art of electronic device manufacturing. In one embodiment, insulating layer 501 is deposited using one of deposition techniques, such as but not limited to a CVD, PVD, MBE, MOCVD, ALD, spin-on, or other deposition techniques known to one of ordinary skill in the art of microelectronic device manufacturing.

Figure 6A:
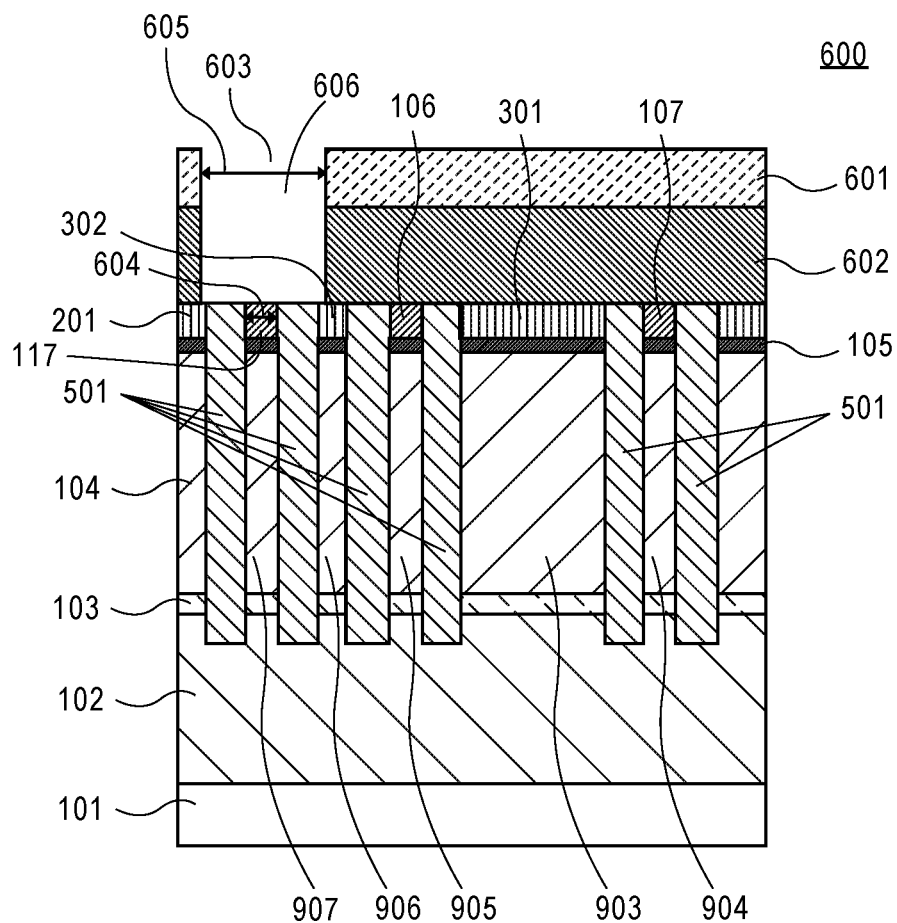
FIG. 6A is a view similar to FIG. 5A after patterning a hard mask layer to create a via in the underlying interconnect layer according to one embodiment.
Figure 6B:
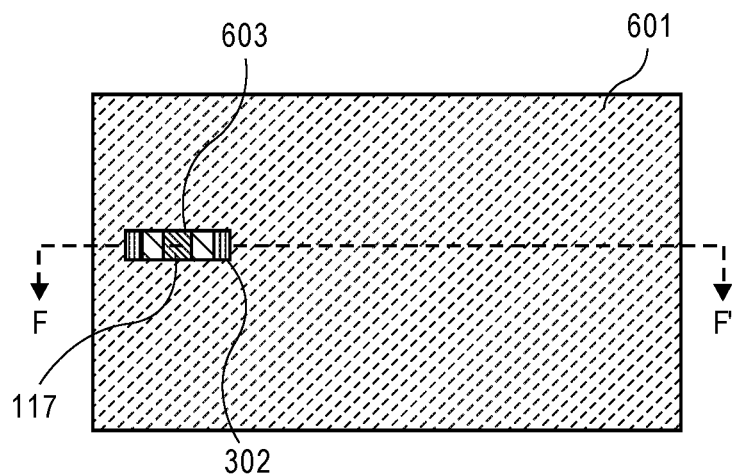
FIG. 6B is a top view of the portion of electronic device structure shown in FIG. 6A.

FIG. 6A is a view 600 similar to FIG. 5A after patterning a hard mask layer 602 on hard mask features of the hard mask layers 111 and 201 to create a via in underlying interconnect layer 104 according to one embodiment. FIG. 6B is a top view 610 of the portion of electronic device structure shown in FIG. 6A. View 600 is a cross-sectional view along an axis F-F'.

As shown in FIGS. 6A and 6B, hard mask layer 602 is patterned through a patterned photoresist layer 601 to form an opening 603. Opening 603 exposes an underlying hard mask feature 117 of hard mask layer 111, portions of the insulating layer 501 and at least a portion of hard mask feature 302 adjacent to the hard mask feature 117. As shown in FIG. 6A, a width 605 of opening 603 is greater than a width 604 of the underlying hard mask feature 117. As shown in FIG. 6A, hard mask feature 117 is deposited on interconnect feature 907.

In at least some embodiments, patterned photoresist layer 601 is formed using one of the photoresist deposition and patterning techniques known to one of ordinary skill in the art of electronic device manufacturing.

In one embodiment, hard mask layer 602 is a carbon hard mask layer. In alternative embodiments, hard mask layer 602 is a nitride layer, e.g., a silicon nitride, a silicon oxide nitride, silicon oxide, amorphous silicon, polysilicon, a carbon layer, e.g., amorphous carbon, silicon carbide, germanium, TiN, other hard mask layer, or any combination thereof. The hard mask layer 602 can be deposited and patterned using one of the hard mask layer deposition and patterning techniques known to one of ordinary skill in the art of electronic device manufacturing.

Figure 7A:
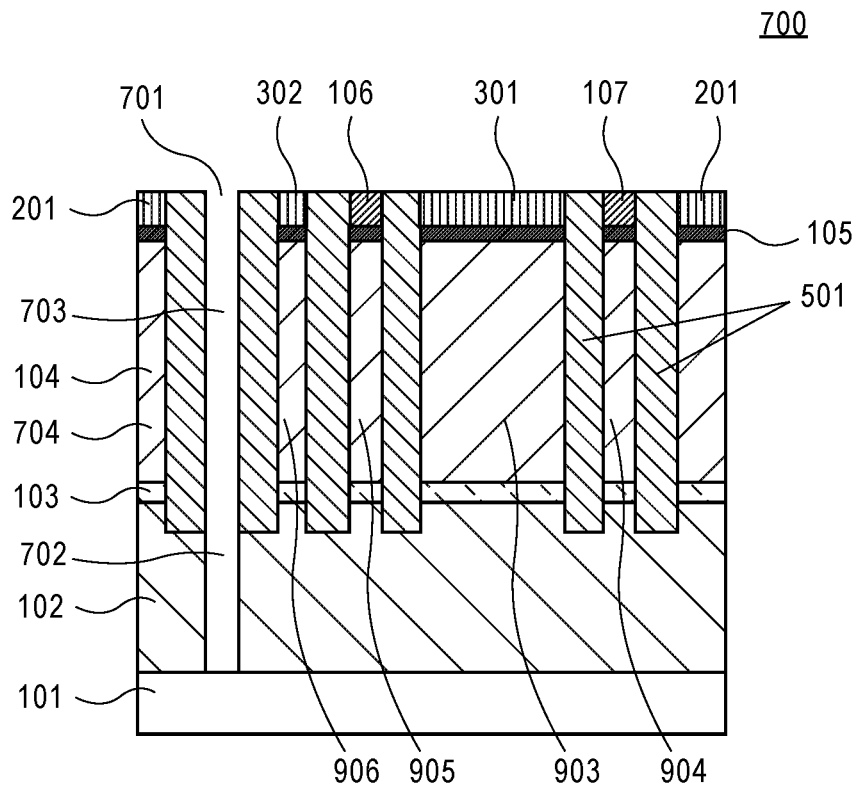
FIG. 7A is a view similar to FIG. 6A after an opening is formed in the insulating layer to provide a via below according to one embodiment.
Figure 7B:
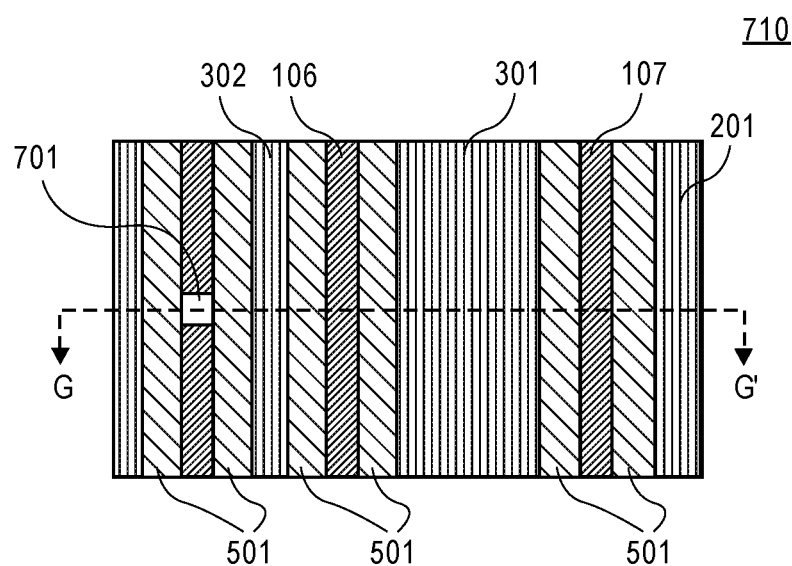
FIG. 7B is a top view of the portion of electronic device structure shown in FIG. 7A.

FIG. 7A is a view 700 similar to FIG. 6A after an opening 701 is formed in insulating layer 102 to provide a via below according to one embodiment. FIG. 7B is a top view 710 of the portion of electronic device structure shown in FIG. 7A. View 700 is a cross-sectional view along an axis G-G'. As shown in FIG. 7A, opening 701 has a trench portion 703 in interconnect layer 104 and a via portion 702 in insulating layer 102. In one embodiment, opening 701 is a via opening.

As shown in FIG. 7A, hard mask feature 604, the underlying portions of the hard mask layer 105, interconnect feature 907, etch stop layer 103 and insulating layer 104 are removed to form opening 701. In one embodiment, hard mask feature 604 and the underlying portion of the hard mask layer 105 are removed by etching using one or more hard mask etching techniques known to one of ordinary skill in the art of the electronic device manufacturing. In one embodiment, hard mask feature 604 is selectively etched through the opening 603, so that the portions of insulating layer 501 and the hard mask features of hard mask layer 201 adjacent to the hard mask feature 604 remain unaffected by etching.

In one embodiment, the feature 907 and the underlying portions of the etch stop layer 103 and insulating layer 104 are removed using one or more dry etching techniques known to one of ordinary skill in the art of electronic device manufacturing. In one embodiment, the feature 907 and the portions of the etch stop layer 103 and insulating layer underneath the interconnect feature 907 are removed using one or more plasma etching techniques. In alternative embodiments, the feature 907 and the portions of the etch stop layer 103 and insulating layer underneath the interconnect feature 907 are removed using one or more of the wet etching, dry etching, or a combination thereof techniques known to one of ordinary skill in the art of microelectronic device manufacturing.

As shown in FIG. 7A, the via opening etch selectively etches only the interconnect feature 907 and does not etch the adjacent interconnect features, e.g., interconnect feature 906. In one embodiment, the interconnect feature 907 is etched using one etching process, then the underlying portions of the etch stop layer 103 and the adhesion layer (if any), and via ILD layer 104 are etched using another etching process. In another embodiment, the interconnect feature 907 and the underlying portions of the etch stop layer 103 and insulating layer 104 are etched in one etching process.

In one embodiment, the chemistries to etch each of the interconnect feature 907 and the underlying portions of the etch stop layer 103 and insulating layer 104 are similar. In another embodiment, the chemistries to etch each of the interconnect feature 907 and the underlying portions of the etch stop layer 103 and insulating layer 104 are different.

Figure 8A:
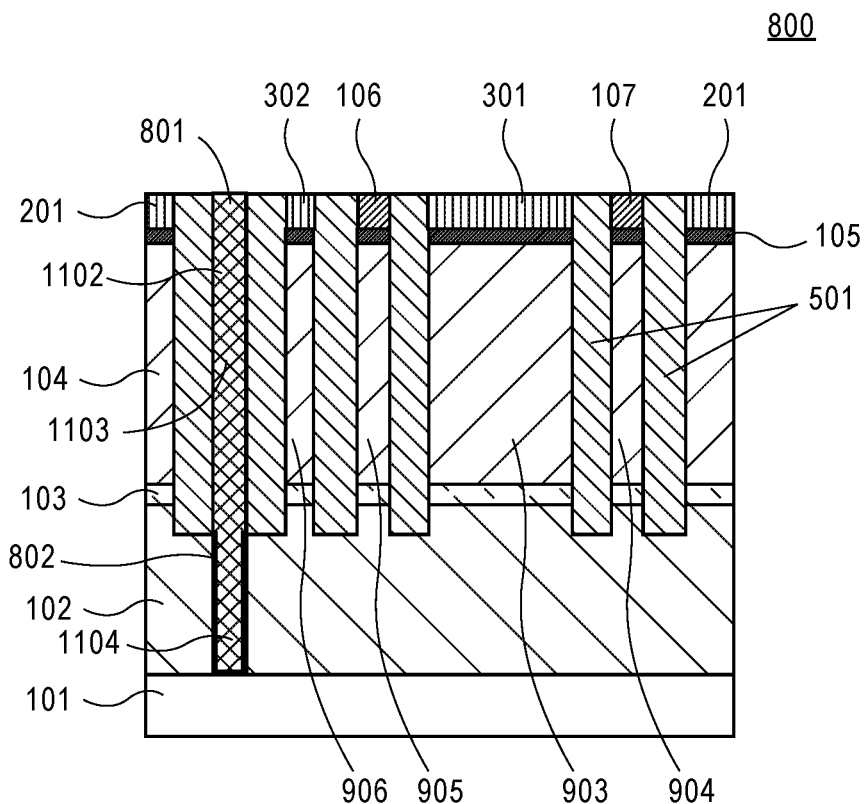
FIG. 8A is a view similar to FIG. 7A after a gap fill layer is deposited into the opening to form an interconnect feature according to one embodiment.
Figure 8B:
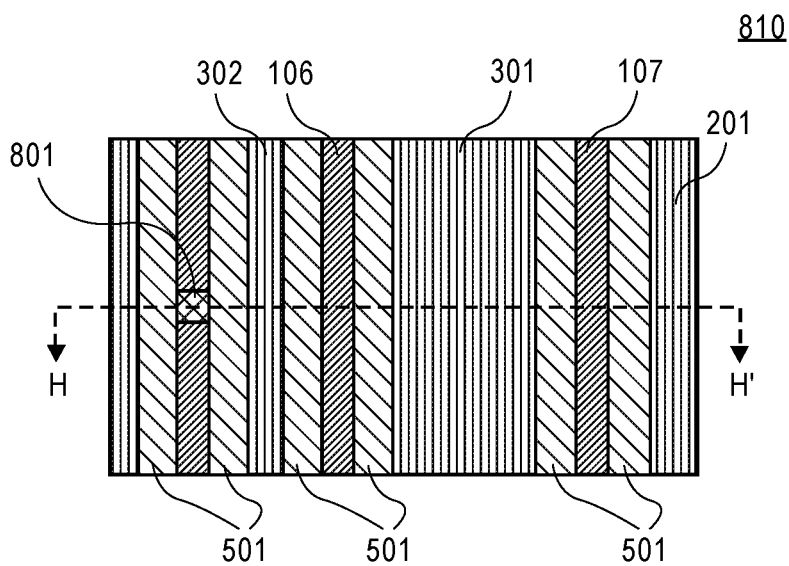
FIG. 8B is a top view of the portion of electronic device structure shown in FIG. 8A.

FIG. 8A is a view 800 similar to FIG. 7A after a gap fill layer 801 is deposited into the opening 701 to form an interconnect feature 1102 according to one embodiment. FIG. 8B is a top view 810 of the portion of electronic device structure shown in FIG. 8A. View 800 is a cross-sectional view along an axis H-H'.

In one embodiment, the portions of the gap fill layer 801 that extend above the top of the hard mask features of layers 111 and 201 and insulating layer 501 are removed using one or more chemical-mechanical polishing (CMP) techniques known to one of ordinary skill in the art of microelectronic device manufacturing. As shown in FIG. 8A, an interconnect feature 1102 comprises a line portion 1103 and a via portion 1104. As shown in FIG. 8A, the gap fill layer 801 fills the via portion 702 of the opening 701 to form via portion 1102. The gap fill layer 801 fills the trench portion 703 of the opening 701 to form line portion 1103.

In one embodiment, gap fill layer 801 is a conductive layer. In one embodiment, gap fill layer 801 is a subtractive metal layer, e.g., Cu, W, Ru, Co, Al, Ag, or other metal layer that can be subtractively patterned. In another embodiment, gap fill layer 801 is a semiconductor layer, e.g., a silicon layer (polysilicon, amorphous silicon), a germanium layer (polygermanium, amorphous germanium), a silicon germanium (SiGe) layer, other semiconductor layer, or any combination thereof.

In one embodiment, the material of the gap fill layer in the via portion 702 is similar to the material of the gap fill layer in the trench portion 703. In another embodiment, the material of the gap fill layer in the via portion 702 is different from the material of the gap fill layer in the trench portion 703. In one embodiment, the gap fill layer 801 has conductivity that is similar to the interconnect layer 104. In one embodiment, the gap fill layer 801 is of the same material as the interconnect layer 104.

In one embodiment, the gap fill layer is a metal layer, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the gap fill layer 801 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

Gap fill layer 801 may be deposited using any of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing. In one embodiment, the gap fill layer 801 is deposited into opening 701 by an electroplating process, electroless plating, or the like techniques.

As shown in FIG. 8A, a liner layer 802 is deposited into the via portion 702 of the opening 701 and the gap fill layer 801 is deposited on the liner layer 802. Liner layer 802 covers the bottom and opposing sidewalls of the via portion 702 in insulating layer 102. As shown in FIG. 8A, the liner layer 802 is only in the via ILD portion and the gap fill layer 801 is deposited on the opposing sidewalls of the trench portion opening 703 in the interconnect layer 104. There is no liner layer 802 in the trench portion opening 703, as the liner in the trench portion may increase the trench line resistance. An embodiment of a method to form a liner in the via portion in the insulating layer is described with respect to FIGS. 12A-12D.

In one embodiment, the thickness of the liner layer 802 is in an approximate range from about 0.5 nm to about 5 nm. In more specific embodiment, the thickness of the liner layer 802 is in an approximate range from about 1 nm to about 2 nm. In one embodiment, liner layer 802 is one of the conductive materials described above with respect to gap fill layer 801. In one embodiment, the materials of the fill and liner layers are different.

In one embodiment, the liner layer 801 includes aluminum, titanium, titanium nitride, tantalum, tantalum nitride, tungsten, cobalt, ruthenium, the like metals, or any combination thereof. Generally, the liner layer is used to provide adhesion for the gap fill layer to the insulating layer. In one embodiment, a barrier layer (not shown) is deposited on the liner layer to prevent diffusion of the conductive material from the gapfill layer into the insulating layer. In one embodiment, the barrier layer is one of the conductive materials described above with respect to liner layer. In one embodiment, the materials of the barrier layer and liner layers are different. In another embodiment, the materials of the barrier layer and liner layers are similar.

Liner layer 802 may be deposited using any of deposition techniques, such as but not limited to a CVD, PVD, MBE, MOCVD, ALD, eletroless, eltroplating or other deposition techniques known to one of ordinary skill in the art of microelectronic device manufacturing.

FIG. 12A is a view 1200 showing a portion of the electronic device structure similar to a portion 704 shown in FIG. 7A. As shown in FIG. 12A, the via portion 702 of the opening 701 extends down to a substrate 1201. In one embodiment, substrate 1201 represents substrate 101.

FIG. 12B is a view 1210 similar to FIG. 12A after a liner layer 1211 is deposited into the opening 701 according to one embodiment. A thin liner layer 1211 is conformally deposited on the bottom and opposing sidewalls of the via portion 702 and opposing sidewalls of the trench portion 703 of opening 701, as shown in FIG. 12B. In one embodiment, liner 1211 represents liner 802.

FIG. 12C is a view 1220 similar to FIG. 2B after a hard mask layer 1212 is deposited on a portion of the liner 1211 in the via portion 702 of the opening 701 and the liner layer 1211 is recessed according to one embodiment. In one embodiment, hard mask layer 1212 is a carbon hard mask layer. In alternative embodiments, hard mask layer 1212 is one of the hard mask layers described above. In one embodiment, hard mask layer 1212 is deposited using one of the hard mask layer deposition techniques known to one of ordinary skill in the art of microelectronic device manufacturing.

As shown in FIG. 12C, the liner layer 1211 is selectively removed from the trench portion 703. The liner layer 1211 is recessed down to the via portion 702, so that the sidewalls of the trench portion 703 and the top of the hard mask layer 1212 that represents the bottom of the trench portion 703 are exposed. In one embodiment, the liner layer 1211 is selectively removed from the trench portion 703 using wet etch cleans. In alternative embodiments, the liner layer 1211 is recessed using a dry etching, a wet etching, or both etching techniques.

FIG. 12D is a view 1230 similar to FIG. 2C after removing hard mask layer 1212 and depositing a gap fill layer 1231 in the opening 701 according to one embodiment.

As shown in FIG. 12D, the hard mask layer 1212 is removed, and the liner 1211 remains only in the via portion 702. In one embodiment, the hard mask layer 1212 is removed using one of the hard mask removal techniques (e.g., an ashing) known to one of ordinary skill in the art of microelectronic device manufacturing. After the hard mask layer is removed, the gap fill layer 1231 is deposited into the opening 701. In one embodiment, gap fill layer 1231 represents the gap fill layer 801.

Returning back to FIG. 8A, in at least some embodiments, the gap fill layer 801 is a semiconductor layer, such as silicon (e.g., poly-silicon, amorphous silicon), germanium (polygermanium, amorphous germanium), other semiconductor layer, or any combination thereof, and a metal is deposited on the semiconductor gap fill layer to form a conductive alloy (e.g., silicide, germanide, or other conductive alloy) of the gap fill layer, as described in further detail below with respect to FIGS. 9A-9C.

Figure 9A:
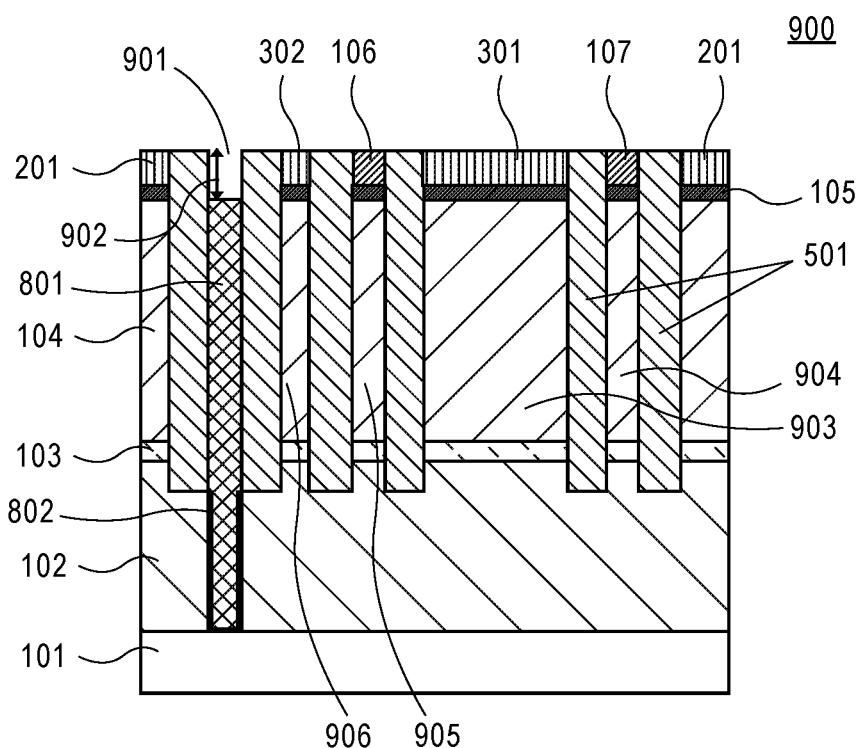
FIG. 9A is a view similar to FIG. 8A after the gap fill layer is recessed according to one embodiment.

FIG. 9A is a view 900 similar to FIG. 8A after the gap fill layer 801 is recessed according to one embodiment. In one embodiment, gap fill layer 801 represents one of the semiconductor layers described above. Gap fill layer 801 is recessed down to a predetermined depth 901, as shown in FIG. 9A. In one embodiment, the depth 901 is determined by the thickness of the metal layer deposited on the recessed gap fill layer later on in a process. In one embodiment, gap fill layer 801 is etched using one or more of wet or dry etching techniques known to one of ordinary skill in the art of microelectronic device manufacturing.

Figure 9B:
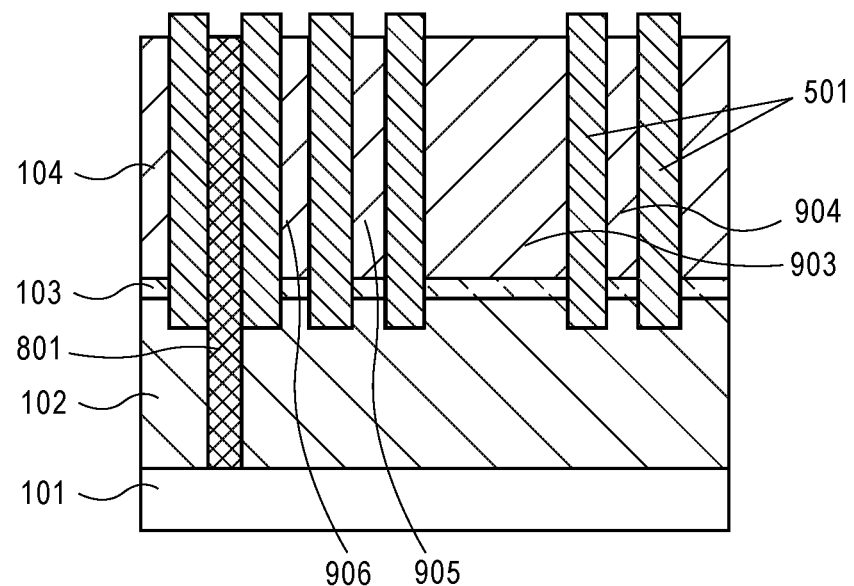
FIG. 9B is a view similar to FIG. 9A after the hard mask features are removed according to one embodiment.

FIG. 9B is a view 910 similar to FIG. 9A after hard mask features 106, 107 of the hard mask layer 111 and hard mask features 301 and 302 of the hard mask layer 201 are removed according to one embodiment. The hard mask features are selectively etched to expose the top portions of the interconnect features 903, 904, 905 and 906. As shown in FIG. 9B, the top portions of the interconnect features 903, 904, 905 and 906 and the top portion of the recessed gap fill layer 801 represent bottoms of the trenches between portions of the insulating layer 501. In one embodiment, the hard mask features of the hard mask layers 201 and 111 are selectively etched using one or more selective hard mask etching techniques known to one of ordinary skill in the art of microelectronic device manufacturing.

Figure 9C:
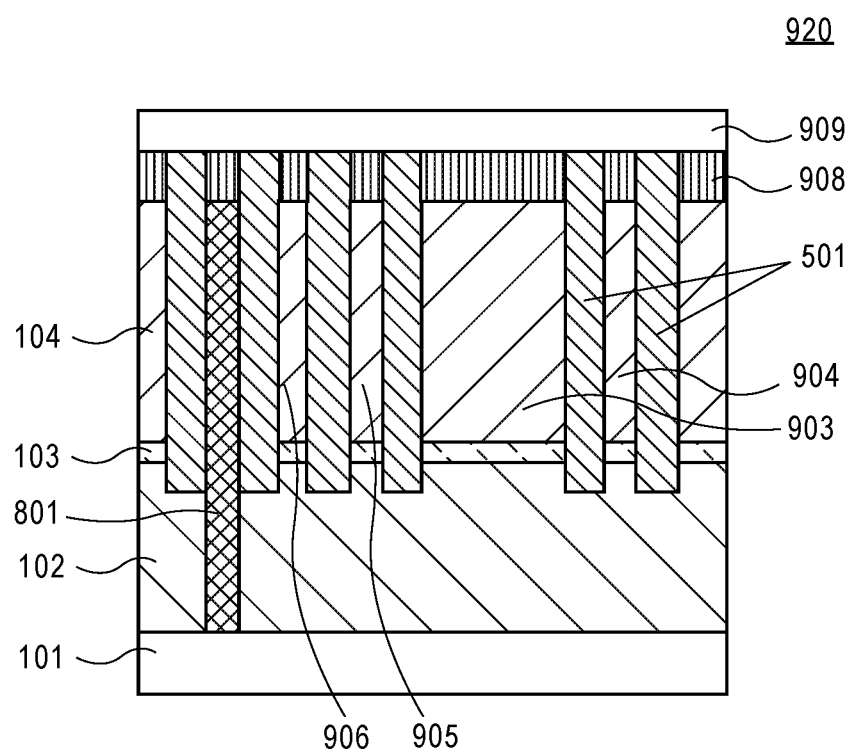
FIG. 9C is a view similar to FIG. 9B after a metal layer is deposited on the metal layer on the exposed top portions of the interconnect features and the recessed gap fill layer according to one embodiment.

FIG. 9C is a view 910 similar to FIG. 9B after a metal layer 909 is deposited on a metal layer 908 on the exposed top portions of the interconnect features and the recessed gap fill layer according to one embodiment. In one embodiment, metal layer 909 is one of the metal layers described above, and metal layer 908 is other one of the metal layers described above. In one embodiment, metal layer 909 is a titanium nitride layer. In one embodiment, metal layer 908 is a nickel layer, a cobalt layer, or a combination thereof. In one embodiment, layer 909 of the titanium nitride is deposited on the layer 908 of at least one of nickel or cobalt to prevent oxidation of the underlying at least one of silicon or germanium gap fill layer 801 during the anneal later in a process. In alternative embodiments, each of the metal layers 909 and 908 is deposited using one of deposition techniques, such as but not limited to a CVD, PVD, MBE, MOCVD, ALD, spin-on, or other deposition techniques known to one of ordinary skill in the art of microelectronic device manufacturing.

In one embodiment structure comprising the metal layer 909 on metal layer 908 on interconnect layer 104 and gap fill layer 801 is annealed at the temperature in an approximate range from about 300 degrees C. to about 650 degrees C. in an inert ambient comprising an inert gas, a hydrogen gas, a nitrogen gas (e.g., NH3, N2, N2/H2) for a time interval from about 30 seconds (s) to about 120 s to form the silicide or germanide gap fill layer. In one embodiment, each of the interconnect layer 104 and gap fill layer 801 is one of the silicon or germanium described above. In this case, the annealing converts each of the interconnect layer 104 and gap fill layer 801 into respective silicide or germanide.

Returning back to FIG. 8A, in at least some embodiments, the gap fill layer 801 is one or more of the metal layers described above, and the gap fill layer 801 is annealed at a temperature greater than a room temperature to create a seamless via-trench metal transition, as described in further detail below with respect to FIG. 10.

Figure 10:
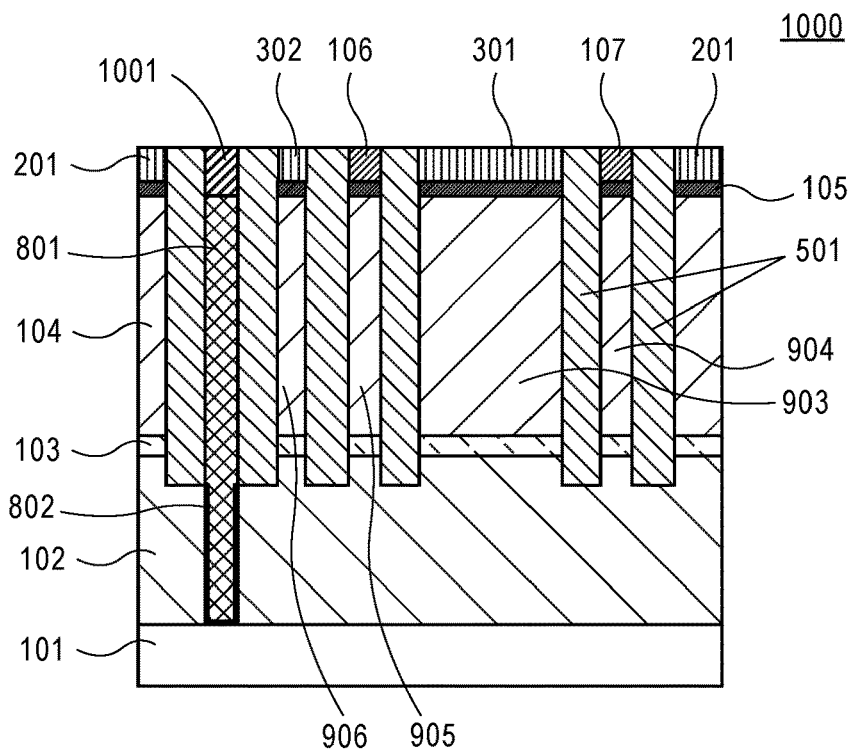
FIG. 10 is a view similar to FIG. 8A after the gap fill layer is recessed and a hard mask layer is deposited onto the recessed fill gap layer according to another embodiment.

FIG. 10 is a view 1000 similar to FIG. 8A after the gap fill layer is recessed and a hard mask layer 1001 is deposited onto the recessed fill gap layer 801 according to another embodiment. As shown in FIG. 10, the gap fill layer 801 is recessed down to a predetermined depth, and a hard mask layer is deposited onto the recessed gap fill layer 801 using one of the hard mask layer deposition techniques described above. In one embodiment, the top surface of the hard mask layer 1001 is evened out with both top surfaces of the hard mask layers 111 and 201 and also the insulating layer 501 using one of the CMP techniques, known to one of ordinary skill in the art of microelectronic device manufacturing. In one embodiment, the recessed gap fill layer 801 is one of the metal layers described above. In one embodiment, hard mask layer 1001 represents one of the hard mask layers described above.

In one embodiment, a metal of the via portion of the gap fill layer 801 that is in ILD layer 102 is different from a metal of the trench portion of the gap fill layer that is in the interconnect layer. In another embodiment, a metal of the via portion of the gap fill layer 801 that is in ILD layer 102 is similar to the metal of the trench portion of the gap fill layer that is in the interconnect layer.

In one embodiment, the structure 1000 is annealed to heal the seams between the via metal portion in the ILD layer 102 and trench metal portion in the interconnect layer 104 so that an interface between the via metal portion and the trench metal portion of the gap fill layer 801 is seamless. In one embodiment the annealing is performed at the temperature in an approximate range from about 400 degrees C. to about 550 degrees C. in an environment comprising an inert gas, a hydrogen gas, a nitrogen gas (e.g., NH3, N2/H2) or any combination thereof.

Figure 11A:
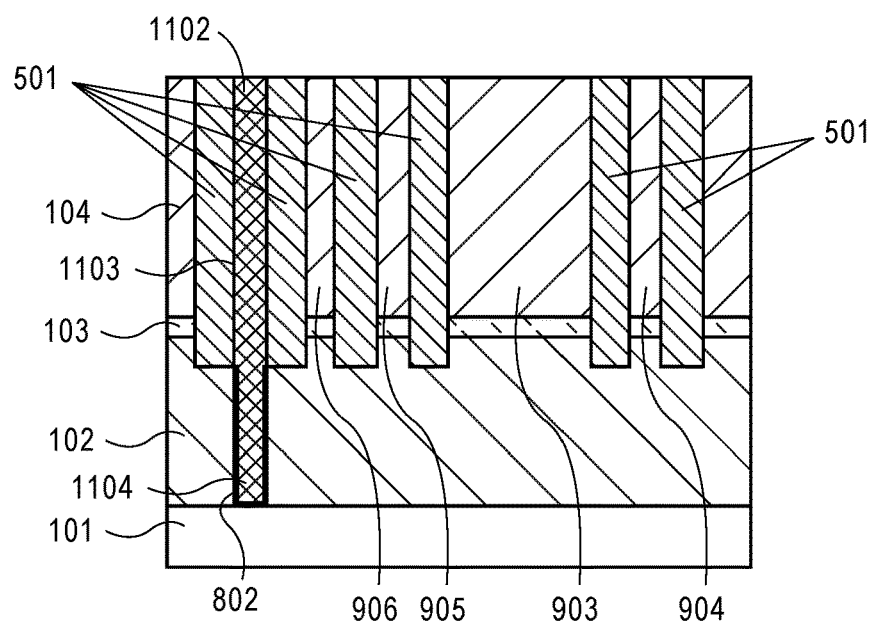
FIG. 11A is a view similar to FIG. 8A after the hard mask layers are removed according to one embodiment.
Figure 11B:
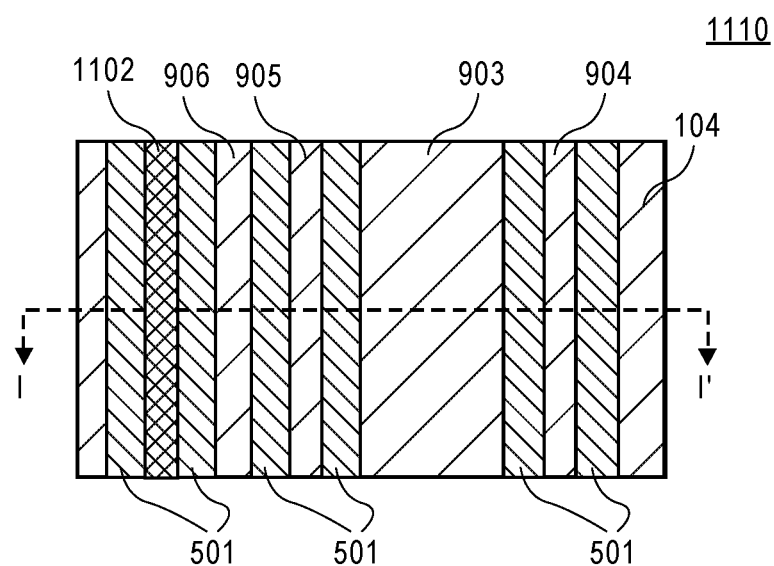
FIG. 11B is a top view of the portion of electronic device structure shown in FIG. 11A.

FIG. 11A is a view 1100 similar to FIG. 8A after the hard mask and hard mask layers are removed according to one embodiment. FIG. 11B is a top view 1110 of the portion of electronic device structure shown in FIG. 11A. View 1100 is a cross-sectional view along an axis I-I'.

As shown in FIGS. 11A and 11B, the hard mask layers are removed to expose the top surfaces of the interconnect features 903, 904, 905 and 906 and the top surface of the interconnect feature 1102.

In one embodiment, before the hard mask layers are removed, the structure is subjected to the thermal annealing, as described above with respect to FIGS. 9A-9C or FIG. 10. In one embodiment, the hard mask layers are removed using one or more hard mask removal techniques, e.g., an ashing technique using plasma, or any other hard mask removal technique known to one of ordinary skill in the art of microelectronic device manufacturing. In one embodiment, the structure is planarized to even out the top surfaces of the conductive features 903, 904, 905, 906 and 1102 and insulating layer 501 using a CMP technique. In one embodiment, breaks are formed in the conductive lines using some of the hard mask features to form conductive line ends.

Figure 13:
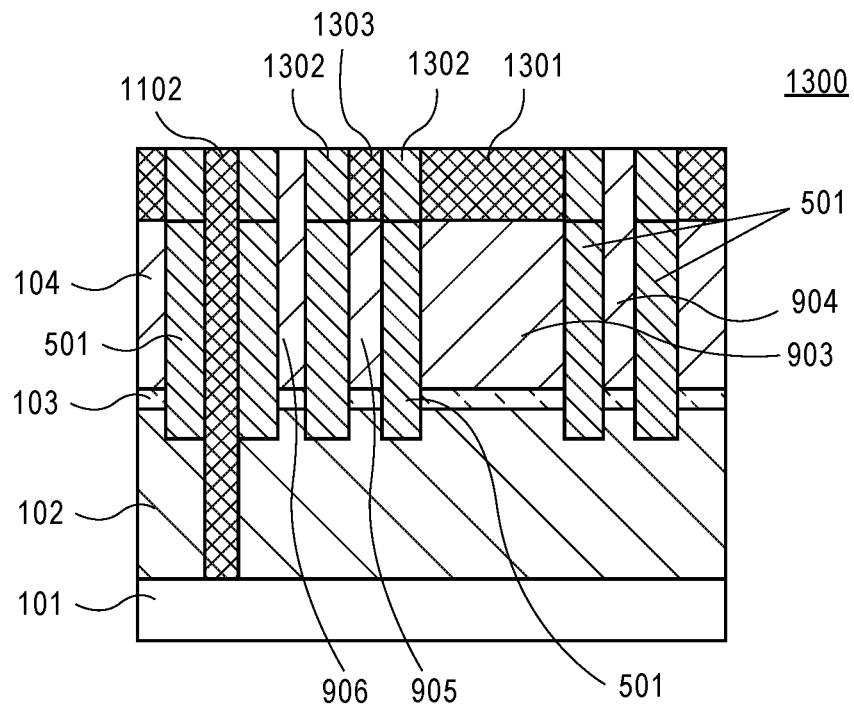
FIG. 13 is a view similar to FIG. 11A after forming vias above some of the interconnect features of interconnect layer according to another embodiment.

FIG. 13 is a view similar to FIG. 11A after forming vias above some of the interconnect features of interconnect layer 104 according to another embodiment. In one embodiment, the structure shown in FIG. 11A is patterned so that some of the interconnect features, such as interconnect features 903 and 905 and portions of the insulating layer 501 can be recessed. The structure is patterned using one of the patterning techniques known to one of ordinary skill in the art of electronic device manufacturing. As shown in FIG. 13, some of the interconnect features, such as interconnect features 903 and 905 and portions of the insulating layer 501 are recessed such that a top surface of other interconnect features, such as interconnect features 904, 906 and 1102 is above the top surface of the recessed interconnect features 903 and 905 and insulating layer 501. In one embodiment, the insulating layer is recessed using one of the insulating layer etching techniques described above. In one embodiment, the interconnect features are recessed using one of the interconnect features etching techniques described above.

As shown in FIG. 13, an overhead via 1301 is formed on the recessed interconnect feature 903 and an overhead via 1303 is formed on the recessed interconnect feature 905. An insulating layer 1302 is deposited on the recessed portions of the insulating layer 501. That is, recessing the interconnect features 903 and 905 provides a space for forming the overhead vias 1301 and 1303. As shown in FIG. 13, the overhead vias 1301 and 1303 are formed within the same trench as the interconnect features 903 and 905 respectively, and are therefore referred to herein as being "self-aligned" with the interconnect features 903 and 905. In one embodiment, forming the overhead via involves depositing a conductive layer onto the recessed interconnect feature using one of the conductive layer deposition techniques described above. In one embodiment, the insulating layer 1302 is deposited using one of the insulating layer deposition techniques described above.

Figure 14:
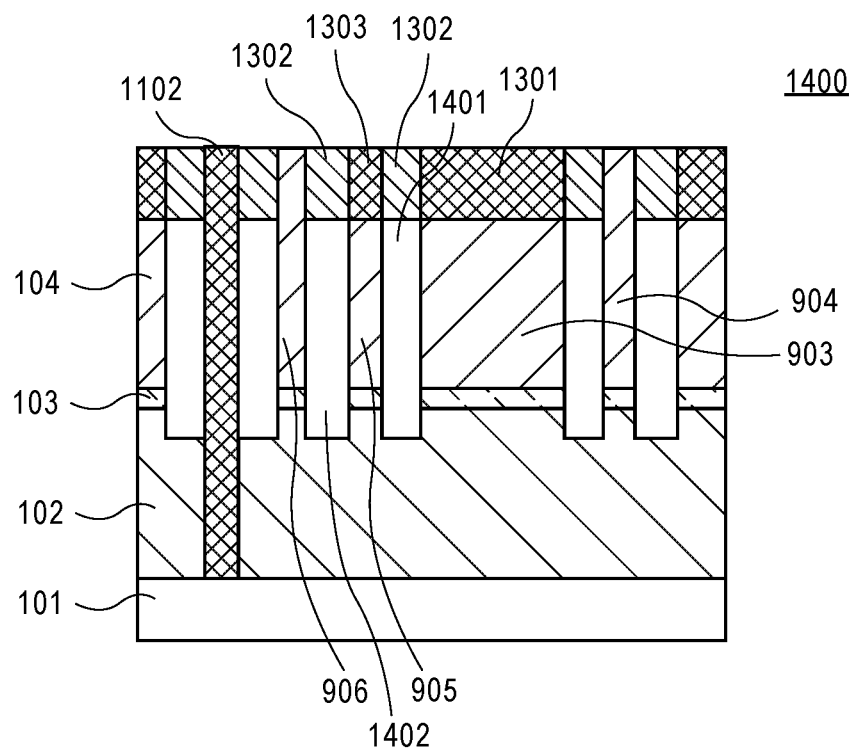
FIG. 14 is a view 1400 similar to FIG. 13, after air gaps are formed between the interconnect features according to another embodiment.

FIG. 14 is a view 1400 similar to FIG. 13, after air gaps 1401 and 1402 are formed between the interconnect features according to another embodiment. Typically, as the pitch between interconnect lines decreases, capacitive coupling between the lines increases. Air gaps 1401 and 1402 are formed to minimize capacitive coupling. For example, an air gap has a k-value of approximately 1. In one embodiment, air gaps are formed by etching portions of the insulating layer 501 using the interconnect features, such as interconnect features 903, 904, 905 and 906 as a hard mask. In one embodiment, the portions of the insulating layer 501 are etched using one of the insulating layer etching techniques described above.

According to an embodiment, the bottom surface of the air gaps 1401 and 1402 are formed by the ILD layer 102. As shown in FIG. 14, the air gaps 1401 and 1402 have a bottom surface that is below a bottom surface of the interconnect features 903 and 904. In another embodiment, the air gaps do not extend below a bottom surface of the interconnect features 903 and 904. As shown in FIG. 14, portions of insulating layer 1302 form the upper surface of the air gaps 1401 and 1402. In one embodiment, insulating layer 1302 is an ILD material that has fill characteristics that do not allow for trenches formed between neighboring interconnect lines to be filled by the material. By way of example, the ILD fill material may be a silicon dioxide, carbon doped silicon dioxide, porous silicon dioxide, silicon nitrides, or the like. In an embodiment, a bottom surface of the insulating layer 1302 extends below a top surface of the interconnect features 903 and 904. In another embodiment, a bottom surface of the insulating layer 1302 does not extend below a top surface of the interconnect features 903 and 904. In one embodiment, the insulating layer 1302 is deposited using one of the insulating layer deposition techniques described above.

Figure 11C:
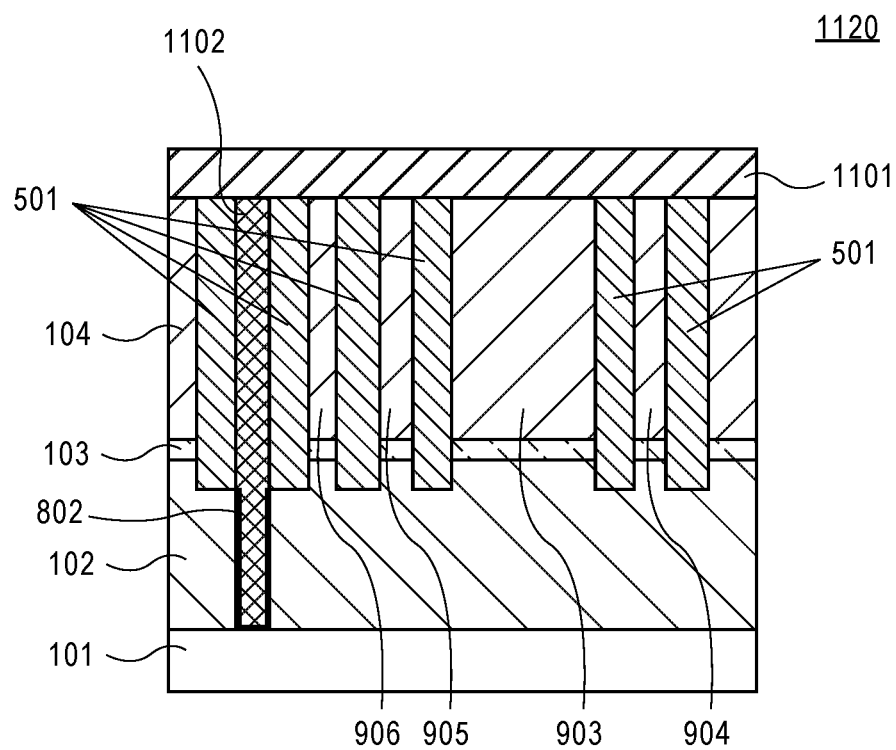
FIG. 11C is a view similar to FIG. 8A, after a next interconnect layer is deposited according to one embodiment.

FIG. 11C is a view 1120 similar to FIG. 8A, after a next interconnect layer 1101 is deposited according to one embodiment. After the formation of the subtractively patterned interconnect structure that has interconnect feature 1102 having line portion the underlying self-aligned via 1104, the patterning process can be extended to create a next interconnect layer 1101 on the exposed portions of the interconnect features 903, 904, 905, 906 and 1102 and on the insulating layer 501. In one embodiment, interconnect layer 1101 includes interconnect lines and vias formed into an insulating layer, as described above. In one embodiment, interconnect layer 1101 includes vias (not shown) self-aligned to the conductive lines of the interconnect layer 104, as described above. In one embodiment, interconnect layer 1101 includes air gaps, as described above.

Figure 15:
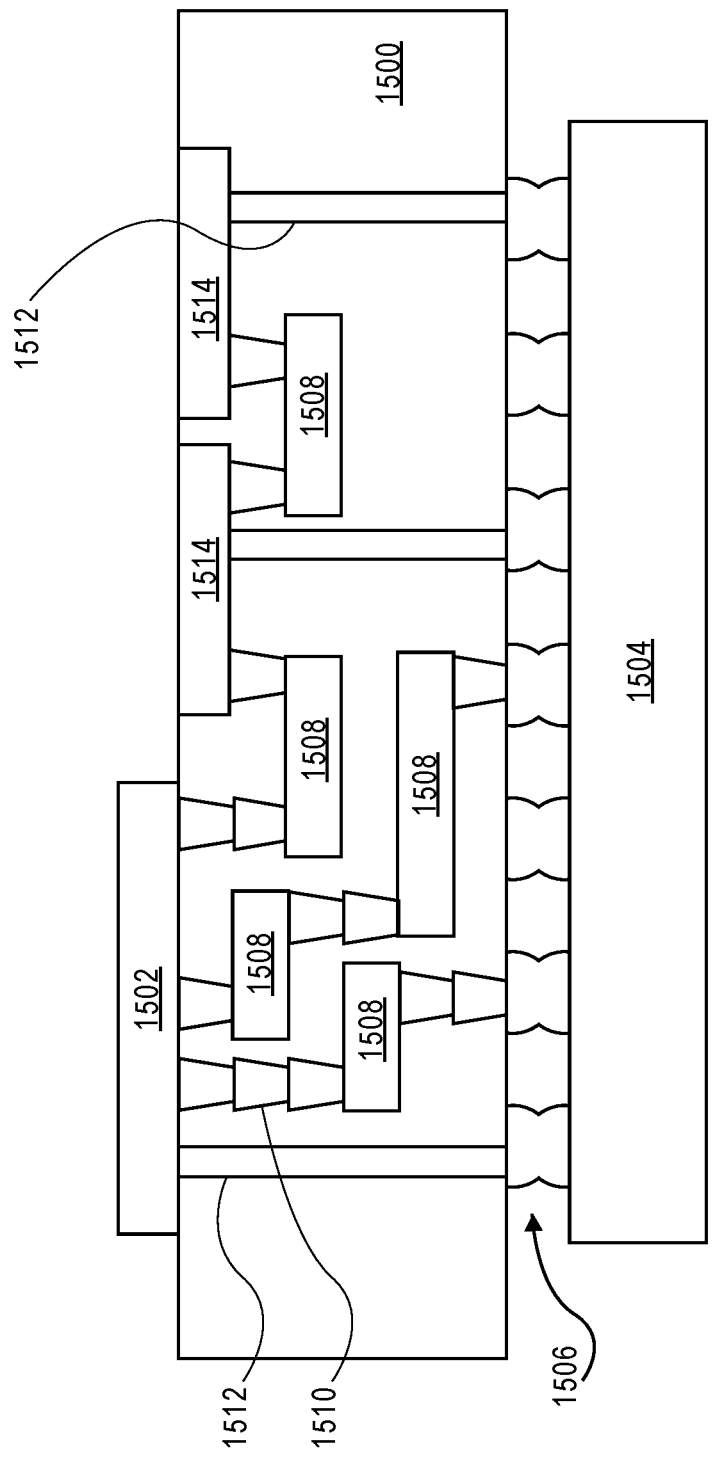
FIG. 15 illustrates an interposer that includes one or more embodiments of the invention.

FIG. 15 illustrates an interposer 1500 that includes one or more embodiments of the invention. The interposer 1500 is an intervening substrate used to bridge a first substrate 1502 to a second substrate 1504. The first substrate 1502 may be, for instance, an integrated circuit die. The second substrate 1504 may be, for instance, a memory module, a computer motherboard, or another integrated circuit die. Generally, the purpose of an interposer 1500 is to spread a connection to a wider pitch or to reroute a connection to a different connection. For example, an interposer 1500 may couple an integrated circuit die to a ball grid array (BGA) 1506 that can subsequently be coupled to the second substrate 1504. In some embodiments, the first and second substrates 1502/1504 are attached to opposing sides of the interposer 1500. In other embodiments, the first and second substrates 1502/1504 are attached to the same side of the interposer 1500. And in further embodiments, three or more substrates are interconnected by way of the interposer 1500.

The interposer 1500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1508, vias 1510 that include the self-aligned vias as described herein, through-silicon vias (TSVs) 1512 and one or more air gaps, as described above. The interposer 1500 may further include embedded devices 1514, including passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1500. In accordance with embodiments of the invention, apparatuses or processes disclosed herein may be used in the fabrication of interposer 1500.

Figure 16:
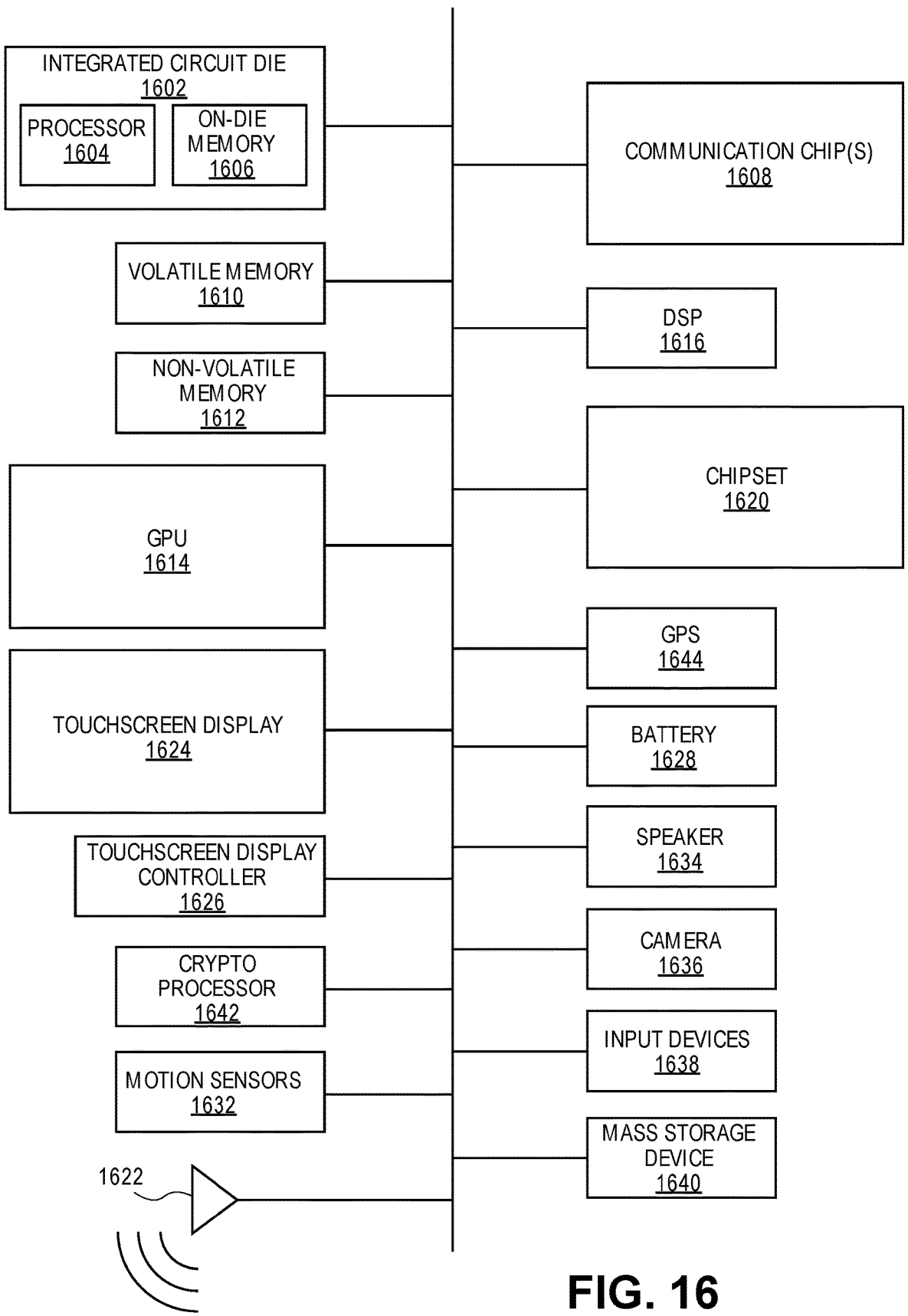
FIG. 16 illustrates a computing device in accordance with one embodiment of the invention.

FIG. 16 illustrates a computing device 1600 in accordance with one embodiment of the invention. The computing device 1600 may include a number of components. In one embodiment, these components are attached to one or more motherboards. In an alternate embodiment, these components are fabricated onto a single system-on-a-chip (SoC) die rather than a motherboard. The components in the computing device 1600 include, but are not limited to, an integrated circuit die 1602 and at least one communication chip 1608. In some implementations the communication chip 1608 is fabricated as part of the integrated circuit die 1602. The integrated circuit die 1602 may include a processor 1604 such as a central processing unit (CPU), an on-die memory 1606, often used as cache memory, that can be provided by technologies such as embedded DRAM (eDRAM) or spin-transfer torque memory (STTM or STTM-RAM).

Computing device 1600 may include other components that may or may not be physically and electrically coupled to the motherboard or fabricated within an SoC die. These other components include, but are not limited to, a volatile memory 1610 (e.g., DRAM), a non-volatile memory 1612 (e.g., ROM or flash memory), a graphics processing unit 1614 (GPU), a digital signal processor 1616 (DSP), a crypto processor 1642 (a specialized processor that executes cryptographic algorithms within hardware), a chipset 1620, an antenna 1622, a display or a touchscreen display 1624, a touchscreen display controller 1626, a battery 1628 or other power source, a global positioning system (GPS) device 1644, a power amplifier (PA), a compass, a motion coprocessor or sensors 1632 (that may include an accelerometer, a gyroscope, and a compass), a speaker 1634, a camera 1636, user input devices 1638 (such as a keyboard, mouse, stylus, and touchpad), and a mass storage device 1640 (such as hard disk drive, compact disk (CD), digital versatile disk (DVD), and so forth).

The communication chip 1608 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips 1608. For instance, a first communication chip 1608 may be dedicated to shorter range wireless communications such as Wi-Fi and Bluetooth and a second communication chip 1608 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 1602, communication chip 1608, GPU 1614, cryptoprocessor 1642, DSP 1616, chipset 1620), and other components may include one or more self-aligned vias formed in accordance with embodiments of the invention. In further embodiments, another component housed within the computing device 1600 may contain one or more self-aligned vias formed in accordance with embodiments of the invention.

In various embodiments, the computing device 1600 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

A method to manufacture an electronic device comprises forming a plurality of interconnect features in an interconnect layer on a first insulating layer on a substrate; forming an opening in the first insulating layer through at least one of the interconnect features; and depositing a gap fill layer in the opening.

A method to manufacture an electronic device comprises depositing a first patterned hard mask layer on an interconnect layer on a first insulating layer on a substrate; depositing a fillable hard mask layer on the interconnect layer; forming trenches in the interconnect layer using the first patterned hard mask layer and the fillable hard mask layer as a mask to form a plurality of interconnect features; depositing a second insulating layer into the trenches, wherein the first insulating layer is etch selective to the second insulating layer; and forming an opening in the first insulating layer through at least one of the interconnect features; and depositing a gap fill layer in the opening.

A method to manufacture an electronic device comprises depositing a first patterned hard mask layer on an interconnect layer on a first insulating layer on a substrate to create first hard mask features; depositing spacers adjacent to the first hard mask features; depositing a fillable hard mask layer on the interconnect layer, wherein the spacers are removed after the fillable hard mask layer is deposited to create second hard mask features; forming trenches in the interconnect layer using the first patterned hard mask layer and the fillable hard mask layer as a mask to form a plurality of interconnect features; depositing a second insulating layer into the trenches, wherein the first insulating layer is etch selective to the second insulating layer; and forming an opening in the first insulating layer through at least one of the interconnect features; and depositing a gap fill layer in the opening.

A method to manufacture an electronic device comprises forming a plurality of interconnect features in an interconnect layer on a first insulating layer on a substrate; depositing a second patterned hard mask layer on the interconnect features; etching at least one of the interconnect features through the second patterned hard mask layer to form an opening in the first insulating layer; and depositing a gap fill layer in the opening.

A method to manufacture an electronic device comprises forming a plurality of interconnect features in an interconnect layer on an etch stop layer a first insulating layer on a substrate; etching the etch stop layer through at least one of the interconnect features to form an opening in the first insulating layer; and depositing a gap fill layer in the opening.

A method to manufacture an electronic device comprises forming a plurality of interconnect features in an interconnect layer on a first insulating layer on a substrate; forming an opening in the first insulating layer through at least one of the interconnect features; and depositing a gap fill layer in the opening, wherein the opening comprises a via portion underneath the at least one of the interconnect features.

A method to manufacture an electronic device comprises forming a plurality of interconnect features in an interconnect layer on a first insulating layer on a substrate; forming an opening in the first insulating layer through at least one of the interconnect features; depositing a gap fill layer in the opening; and depositing a liner layer into the opening.

A method to manufacture an electronic device comprises forming a plurality of interconnect features in an interconnect layer on a first insulating layer on a substrate; forming an opening in the first insulating layer through at least one of the interconnect features; depositing a hard mask layer into a via portion of the opening; and depositing a gap fill layer in the opening.

A method to manufacture an electronic device comprises forming a plurality of interconnect features in an interconnect layer on a first insulating layer on a substrate; forming an opening in the first insulating layer through at least one of the interconnect features; and depositing a gap fill layer in the opening; recessing the gap fill layer; depositing a conductive layer on the recessed gap fill layer; and annealing the conductive layer.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening.

A method to manufacture a self-aligned via comprises depositing a first hard mask layer on an interconnect layer on a first insulating layer on a substrate; depositing a spacer layer on the interconnect layer; depositing a fillable hard mask layer on the interconnect layer; etching the spacer layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening.

A method to manufacture a self-aligned via comprises depositing an etch stop layer on a substrate; depositing an interconnect layer on a first insulating layer on the first etch stop layer; depositing a first hard mask layer on the interconnect layer; depositing an etch stop layer on the interconnect layer; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening, wherein the first opening is a via underneath the at least one of the interconnect features.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; depositing a gap fill layer into the second opening; and depositing a liner layer into the first opening.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; depositing a gap fill layer into the second opening; recessing the gap fill layer; depositing a conductive layer on the recessed gap fill layer; and annealing the conductive layer.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening, wherein the interconnect layer comprises tungsten, ruthenium, cobalt, aluminum, silver, copper, silicon, germanium, nickel, or any combination thereof.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening, wherein the first insulating layer is etch selective to the second insulating layer.

A method to manufacture a self-aligned via comprises depositing a first hard mask layer on an interconnect layer on a first insulating layer on a substrate; depositing a fillable hard mask layer on the interconnect layer; forming trenches in the interconnect layer to create a plurality of interconnect features; depositing a second insulating layer into the trenches; depositing a third patterned hard mask layer on the second insulating layer; etching at least one of the interconnect features through the third patterned hard mask layer to create a first opening; etching the first insulating layer through the first opening to create a second opening; and depositing a gap fill layer into the second opening, wherein the first hard mask layer is etch selective to the fillable hard mask layer.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features.

An electronic device comprises a plurality of interconnect features in a first interconnect layer on a first insulating layer on a substrate; an opening comprising a trench portion in at least one of the interconnect features and a via portion in the first insulating layer underneath the trench portion; a gap fill layer in the via portion, wherein the via portion is self-aligned to the at least one of the interconnect features; and a liner layer in the via portion.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features; and wherein the interconnect features are conductive lines.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features, wherein the interconnect features comprise tungsten, ruthenium, cobalt, aluminum, silver, copper, silicon, germanium, nickel, or any combination thereof.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features, wherein the material of the gap fill layer is similar to that of the interconnect features.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features, and wherein the material of the gap fill layer is different from that of the interconnect features.

An electronic device comprises a plurality of interconnect features in a first interconnect layer on a first insulating layer on a substrate; an opening comprising a trench portion in at least one of the interconnect features and a via portion in the first insulating layer underneath the trench portion; and a gap fill layer in the via portion, wherein the via portion is self-aligned to the at least one of the interconnect features, wherein the gap fill layer is in the trench portion.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A method to manufacture an electronic device comprising:
   forming a plurality of conductive interconnect structures in a conductive interconnect layer on a first insulating layer on a substrate;
   forming an opening in the first insulating layer through at least one of the conductive interconnect structures; and
   depositing a gap fill layer in the opening.

2. The method of claim 1, further comprising:
   depositing a first patterned hard mask layer on the conductive interconnect layer to create first hard mask features; depositing a fillable hard mask layer on the conductive interconnect layer;
   forming trenches in the conductive interconnect layer using the first patterned hard mask layer and the fillable hard mask layer as a mask; and depositing a second insulating layer into the trenches, wherein the first insulating layer is etch selective to the second insulating layer.

3. The method of claim 1, further comprising:
depositing a second patterned hard mask layer on the conductive interconnect structures; and
etching the at least one of the conductive interconnect structures through the second patterned hard mask layer.

4. The method of claim 1, wherein the opening comprises a via portion underneath the at least one of the conductive interconnect structures.

5. The method of claim 1, further comprising:
depositing a liner layer into the opening.

6. The method of claim 1, further comprising:
depositing a third hard mask layer into a via portion of the opening.

7. The method of claim 1, further comprising:
recessing the gap fill layer;
depositing a conductive layer on the recessed gap fill layer; and
annealing the conductive layer.

8. A method to manufacture a self-aligned via, comprising:
depositing a first hard mask layer on a conductive interconnect layer on a first insulating layer on a substrate;
depositing a fillable hard mask layer on the conductive interconnect layer;
forming trenches in the conductive interconnect layer to create a plurality of conductive interconnect structures;
depositing a second insulating layer into the trenches;
depositing a third patterned hard mask layer on the second insulating layer;
etching at least one of the conductive interconnect structures through the third patterned hard mask layer to create a first opening;
etching the first insulating layer through the first opening to create a second opening; and
depositing a gap fill layer into the second opening.

9. The method of claim 8, further comprising:
depositing a spacer layer on the conductive interconnect layer; and
etching the spacer layer.

10. The method of claim 8, wherein the first opening is a via underneath the at least one of the conductive interconnect structures.

11. The method of claim 8, further comprising:
depositing a liner layer into the first opening.

12. The method of claim 8, further comprising:
recessing the gap fill layer;
depositing a conductive layer on the recessed gap fill layer; and
annealing the conductive layer.

13. The method of claim 8, wherein the conductive interconnect layer comprises tungsten, ruthenium, cobalt, aluminum, silver, copper, silicon, germanium, nickel, or any combination thereof.

14. The method of claim 8, wherein the first insulating layer is etch selective to the second insulating layer.

15. An electronic device, comprising:
a plurality of conductive interconnect structures in a first conductive interconnect layer on a first insulating layer on a substrate;
an opening comprising a trench portion in at least one of the conductive interconnect structures and a via portion in the first insulating layer underneath the trench portion; and
a gap fill layer in the via portion, wherein the via portion is self-aligned to the at least one of the conductive interconnect structures.

16. The electronic device of claim 15, further comprising:
a liner layer in the via portion.

17. The electronic device of claim 15, wherein the conductive interconnect structures are conductive lines.

18. The electronic device of claim 15, wherein the conductive interconnect structures comprise tungsten, ruthenium, cobalt, aluminum, silver, copper, silicon, germanium, nickel, or any combination thereof.

19. The electronic device of claim 15, wherein the material of the gap fill layer is similar to that of the conductive interconnect structures.

20. The electronic device of claim 15, wherein the material of the gap fill layer is different from that of the conductive interconnect structures.

* * * * *